United States Patent
Derner et al.

(10) Patent No.: US 10,153,018 B2
(45) Date of Patent: Dec. 11, 2018

(54) FERROELECTRIC MEMORY CELLS

(71) Applicant: MICRON TECHNOLOGY, INC., Boise, ID (US)

(72) Inventors: Scott J. Derner, Boise, ID (US); Christopher J. Kawamura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/678,978

(22) Filed: Aug. 16, 2017

(65) Prior Publication Data

US 2018/0061468 A1    Mar. 1, 2018

Related U.S. Application Data

(60) Provisional application No. 62/381,942, filed on Aug. 31, 2016.

(51) Int. Cl.
*G11C 11/22* (2006.01)
*H01L 27/11502* (2017.01)
(Continued)

(52) U.S. Cl.
CPC ........ *G11C 11/221* (2013.01); *G11C 11/2253* (2013.01); *G11C 11/2259* (2013.01); *G11C 11/2273* (2013.01); *G11C 11/2275* (2013.01); *G11C 11/2293* (2013.01); *H01L 27/11502* (2013.01); *H01L 27/11507* (2013.01); *H01L 27/11514* (2013.01); *H01L 28/55* (2013.01); *H01L 28/90* (2013.01); *G11C 11/2257* (2013.01)

(58) Field of Classification Search
CPC .............. G11C 11/221; G11C 11/2259; G11C 11/2273; G11C 11/2275; G11C 11/2293; G11C 11/2253; G11C 11/2257; H01L 27/11502; H01L 27/11507; H01L 27/11514; H01L 28/55; H01L 28/90
USPC .......................................... 365/149, 117, 145
See application file for complete search history.

(56) References Cited

U.S. PATENT DOCUMENTS

| 4,103,342 A | 7/1978 | Miersch et al. |
| 5,218,566 A * | 6/1993 | Papaliolios ............... G11C 7/14 |
| | | 365/145 |

(Continued)

FOREIGN PATENT DOCUMENTS

| WO | 2018044485 | 3/2018 |
| WO | 2018044486 A1 | 3/2018 |

(Continued)

OTHER PUBLICATIONS

U.S. Appl. No. 15/679,016, entitled "Apparatuses and Methods Including Ferroelectric Memory and for Operating Ferroelectric Memory", filed Aug. 16, 2017.

(Continued)

*Primary Examiner* — Tan T. Nguyen
(74) *Attorney, Agent, or Firm* — Dorsey & Whitney LLP

(57) ABSTRACT

Apparatuses and methods are disclosed that include ferroelectric memory cells. An example ferroelectric memory cell includes two transistors and two capacitors. Another example ferroelectric memory cell includes three transistors and two capacitors. Another example ferroelectric memory cell includes four transistors and two capacitors.

35 Claims, 22 Drawing Sheets

(51) Int. Cl.
  *H01L 49/02* (2006.01)
  *H01L 27/11507* (2017.01)
  *H01L 27/11514* (2017.01)

(56) References Cited

U.S. PATENT DOCUMENTS

| | | | |
|---|---|---|---|
| 5,241,503 A | 8/1993 | Cheng | |
| 5,373,463 A * | 12/1994 | Jones, Jr. | G11C 11/22 365/145 |
| 5,381,364 A * | 1/1995 | Chern | G11C 11/22 365/145 |
| 5,539,279 A * | 7/1996 | Takeuchi | G11C 11/22 365/145 |
| 5,598,366 A * | 1/1997 | Kraus | G11C 11/22 365/145 |
| 5,617,349 A * | 4/1997 | Koike | G11C 11/22 365/145 |
| 5,675,530 A * | 10/1997 | Hirano | G11C 11/22 365/145 |
| 5,798,964 A * | 8/1998 | Shimizu | G11C 11/22 365/145 |
| 5,818,771 A * | 10/1998 | Yasu | G11C 7/24 365/195 |
| 5,889,696 A * | 3/1999 | Kawakubo | G11C 11/22 365/145 |
| 5,912,846 A * | 6/1999 | Taylor | G11C 11/22 365/145 |
| 5,917,746 A * | 6/1999 | Seyyedy | G11C 11/22 365/145 |
| 5,959,922 A | 9/1999 | Jung | |
| 6,034,884 A * | 3/2000 | Jung | G11C 11/22 365/145 |
| 6,038,160 A * | 3/2000 | Nakane | G11C 11/22 257/E27.104 |
| 6,147,895 A * | 11/2000 | Kamp | G11C 11/22 365/117 |
| 6,154,387 A | 11/2000 | Takata | |
| 6,198,654 B1 | 3/2001 | Ashikaga | |
| 6,229,730 B1 * | 5/2001 | Kato | G11C 11/22 365/145 |
| 6,363,002 B1 * | 3/2002 | Nishimura | G11C 11/22 365/145 |
| 6,483,737 B2 | 11/2002 | Takeuchi et al. | |
| 6,538,914 B1 * | 3/2003 | Chung | G11C 11/22 365/145 |
| 6,687,151 B2 * | 2/2004 | Endo | G05F 1/618 365/145 |
| 6,807,082 B2 * | 10/2004 | Aoki | G11C 11/22 257/E21.664 |
| 6,961,271 B2 | 11/2005 | Jeon et al. | |
| 2002/0044477 A1 | 4/2002 | Takeuchi et al. | |
| 2003/0173604 A1 | 9/2003 | Aoki et al. | |
| 2004/0119105 A1 | 6/2004 | Wilson | |
| 2005/0012125 A1 | 1/2005 | Summerfelt et al. | |
| 2005/0012130 A1 | 1/2005 | Forbes | |
| 2005/0122763 A1 | 6/2005 | Yamamura | |
| 2005/0146918 A1 | 7/2005 | Ogiwara et al. | |
| 2006/0215472 A1 | 9/2006 | Yoon et al. | |
| 2006/0221746 A1 | 10/2006 | Kang et al. | |
| 2006/0285378 A1 | 12/2006 | Yamaoka et al. | |
| 2008/0265300 A1 | 10/2008 | Akiyama et al. | |
| 2009/0010037 A1 | 1/2009 | Kang et al. | |
| 2010/0165704 A1 | 7/2010 | Wu et al. | |
| 2011/0199811 A1 | 8/2011 | Kanno et al. | |
| 2012/0074466 A1 | 3/2012 | Setiadi et al. | |
| 2012/0170348 A1 | 7/2012 | Clinton et al. | |
| 2012/0307545 A1 | 12/2012 | McAdams et al. | |
| 2013/0094274 A1 | 4/2013 | Kaneko | |
| 2014/0036567 A1 | 2/2014 | Fukuzumi et al. | |
| 2018/0061469 A1 | 3/2018 | Derner et al. | |
| 2018/0061471 A1 | 3/2018 | Kawamura et al. | |
| 2018/0061477 A1 | 3/2018 | Kawamura et al. | |

FOREIGN PATENT DOCUMENTS

| | | |
|---|---|---|
| WO | 2018044487 | 3/2018 |
| WO | 2018044510 | 3/2018 |

OTHER PUBLICATIONS

U.S. Appl. No. 15/679,032, entitled "Apparatuses and Methods Including Ferroelectric Memory and for Accessing Ferroelectric Memory", filed Aug. 16, 2017.
U.S. Appl. No. 15/679,042, entitled "Apparatuses and Methods Including Two Transistor-One Capacitor Memory and for Accessing Same", filed Aug. 16, 2017.
Henkels, W.H. et al., "Large-Signal 2T, 1C DRAM Cell: Signal and Layout Analysis", IEEE Journal of Solid-State- Circuits, vol. 29, No. 7, Jul. 1994, 4 pages.
International Search Report and Written Opinion dated Nov. 30, 2017 for PCT Application No. PCT/US2017/045167, pp. all.
U.S. Appl. No. 16/058,202 titled "Apparatuses and Methods Including Ferroelectric Memory and for Operating Ferroelectric Memory" filed Aug. 8, 2018, pp. all.
U.S. Appl. No. 16/131,969, titled "Apparatuses and Methods Including Ferroelectric Memory and for Accessing Ferroelectric Memory", filed Sep. 14, 2018, pp. all.
U.S. Appl. No. 16/104,709 titled "Ferroelectric Memory Cells", filed Aug. 17, 2018, pp. all.
U.S. Appl. No. 16/105,631 titled "Apparatuses and Methods Including Two Transistor-One Capacitor Memory and for Accessing Same", filed Aug. 20, 2018, pp. all.
First Office Action for TW Appiication No. 106128403, dated May 24, 2018, pp. all.
U.S. Appl. No. 16/005,493, titied "Apparatuses and Methods for Memory Including Ferroelectric Memory Cells and Dielectric Memory Cells", filed Jun. 11, 2018, pp. all.

* cited by examiner

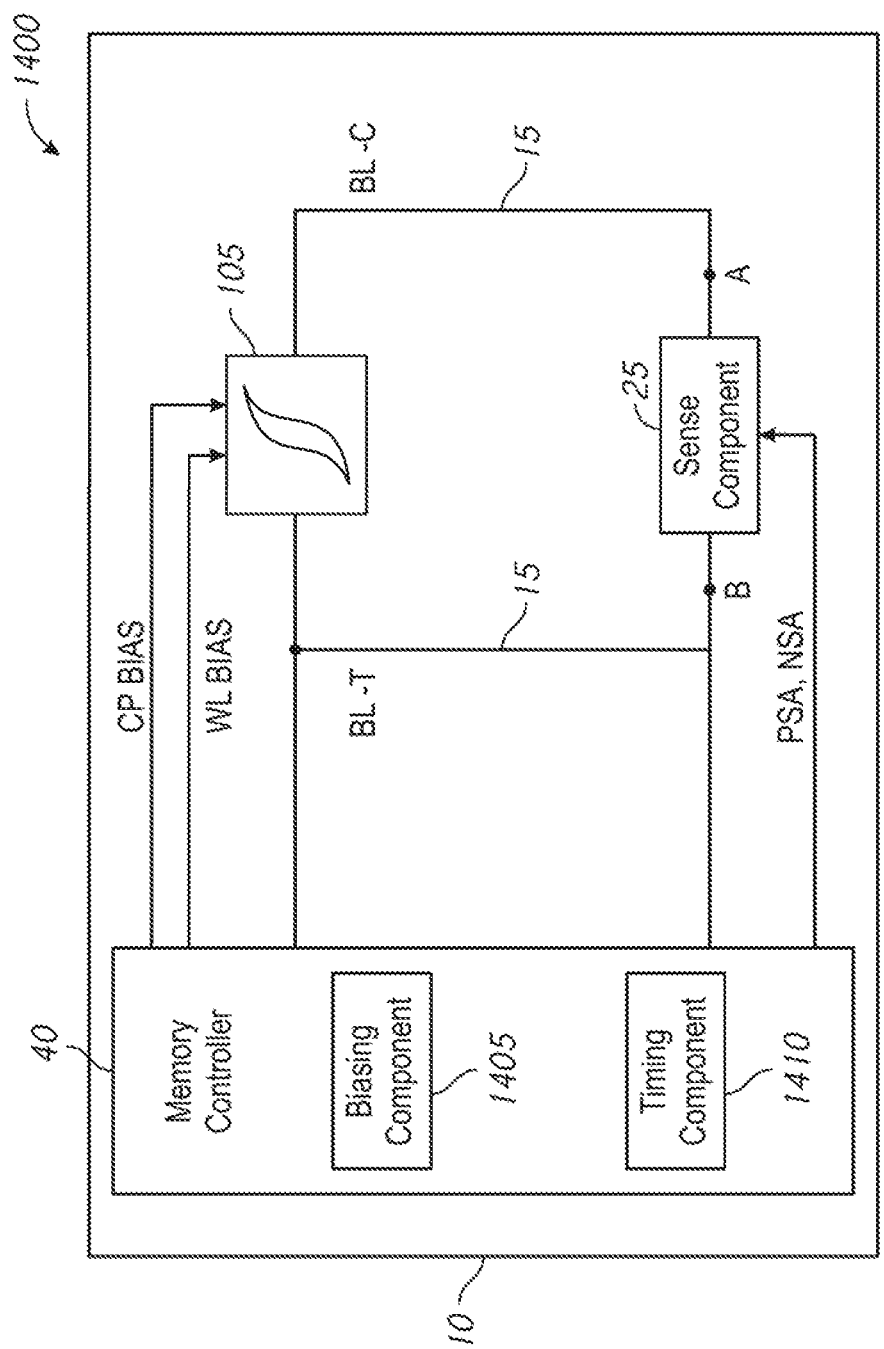

FERROELECTRIC MEMORY CELLS

CROSS-REFERENCE TO RELATED APPLICATION

This application claims the filing benefit of U.S. Provisional Application No. 62/381,942, filed Aug. 31, 2016. This application is incorporated by reference herein in its entirety and for all purposes.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. It is desirable, however, to improve the operation of FeRAM devices. For example, it may be desirable to have improved noise resistance during memory cell sensing, more compact circuits and reduced layout size, and improved timing for operation of FeRAM devices.

BRIEF DESCRIPTION OF THE DRAWINGS

FIG. 14 is a block diagram of a memory array that supports a ferroelectric memory in accordance with various embodiments of the present disclosure.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
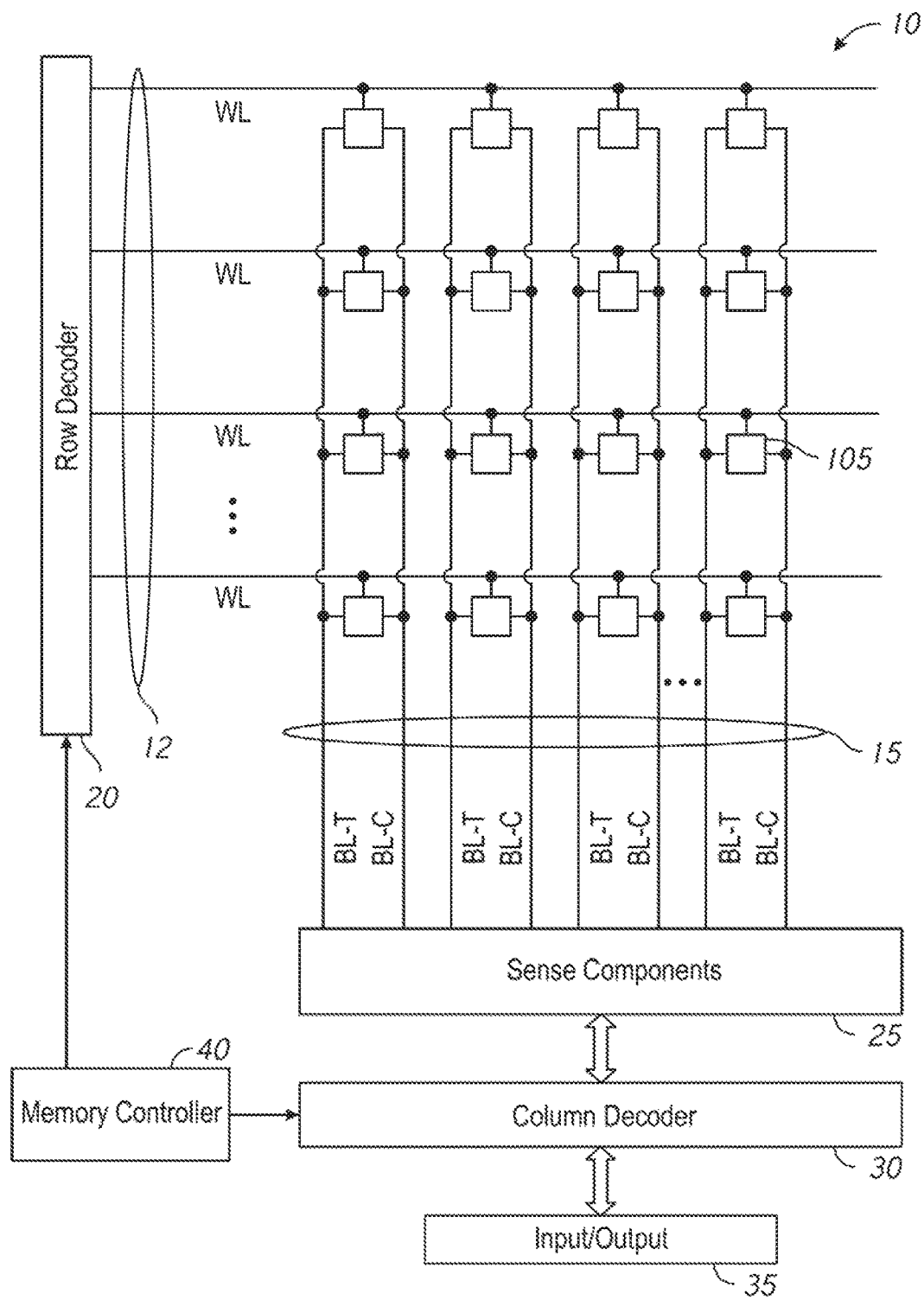
FIG. 1 is a block diagram of an example memory array that supports ferroelectric memory in accordance with various embodiments of the present disclosure.

FIG. 1 illustrates an example memory array 10 that supports ferroelectric memory in accordance with various embodiments of the present disclosure. Memory array 10 may also be referred to as an electronic memory apparatus. Memory array 10 includes memory cells 105 that are programmable to store different states. Each state may represent different logic values. For example, for a memory storing two states, the logic values may be denoted as a logic 0 and a logic 1. In some cases, memory cell 105 is configured to store more than two logic values. A memory cell 105 may include a plurality of capacitors to store a charge representative of the programmable states. For example, charged and uncharged capacitors may represent two logic values, respectively.

A ferroelectric memory cell may include capacitors that have a ferroelectric as the dielectric material. Different levels of charge of a ferroelectric capacitor may represent different logic values. Ferroelectric memory cells 105 may have beneficial properties that may result in improved performance relative to other memory architectures, for example, persistent storage of logic values without the need for periodic refresh operations.

Operations such as reading and writing may be performed on memory cells 105 by activating or selecting the appropriate access lines 12 and digit lines 15. Access lines 12 may also be referred to as word lines 12. Activating or selecting a word line 12 or a digit line 15 may include applying a voltage to the respective line. Word lines 12 and digit lines 15 are made of conductive materials. For example, word lines 12 and digit lines 15 may be made of metals (such as copper, aluminum, gold, tungsten, etc.), metal alloys, doped semiconductors, other conductive materials, or the like. According to the example of FIG. 1, each row of memory cells 105 is coupled to a word line 12 WL, and each column of memory cells 105 is coupled to digit lines 15 BL-T and BL-C. By activating the respective word lines 12 and digit lines 15 (e.g., applying a voltage to the word lines 12 or digit lines 15), a memory cell 105 may be accessed at their intersection. Accessing the memory cell 105 may include reading or writing the memory cell 105. The intersection of a word lines 12 and digit lines 15 may be referred to as an address of a memory cell.

In some architectures, the logic storing device of a cell, e.g., capacitors, may be electrically isolated from the digit lines by selection components. A word line 12 may be coupled to and may control the selection components. For example, the selection components may be transistors and the word line 12 may be coupled to the gates of the transistors. Activating the word line 12 results in an electrical coupling or closed circuit between the capacitors of a memory cell 105 and corresponding digit line 15. The digit lines may then be accessed to either read or write the memory cell 105.

Accessing memory cells 105 may be controlled through a row decoder 20 and a column decoder 30. In some examples, a row decoder 20 receives a row address from the memory controller 40 and activates the appropriate word lines 12 based on the received row address. Similarly, a column decoder 30 receives a column address from the memory controller 40 and activates the appropriate digit lines 15. For example, memory array 10 may include multiple word lines 12, and multiple digit lines 15. Thus, by activating word lines 12 WL and digit lines 15 BL-T and BL-C, the memory cell 105 at their intersection may be accessed.

Upon accessing, a memory cell 105 may be read, or sensed, by sense component 25 to determine the stored state of the memory cell 105. For example, after accessing the memory cell 105, the ferroelectric capacitors of memory cell 105 may discharge onto corresponding digit lines 15. Discharging the ferroelectric capacitors may be based on biasing, or applying a voltage, to the ferroelectric capacitors. The discharging may cause a change in the voltage of the digit lines 15, which sense component 25 may compare to a reference voltage (not shown) in order to determine the stored state of the memory cell 105. For example, if a digit line 15 has a higher voltage than the reference voltage, then sense component 25 may determine that the stored state in memory cell 105 is a logic 1 and vice versa. Sense component 25 may include various transistors or amplifiers in order to detect (e.g., compare) and amplify a difference in the signals, which may include latching the amplified difference. A separate sense component 25 may be provided for each pair of digit lines BL-T and BL-C. The detected logic state of memory cell 105 may then be output through column decoder 30 as output 35.

A memory cell 105 may be programmed, or written, by activating the relevant word lines 12 and digit lines 1S. As discussed above, activating word lines 12 couples the corresponding row of memory cells 105 to their respective digit lines 15. By controlling the relevant digit lines 15 while the word lines 12 are activated, a memory cell 105 may be written—e.g., a logic value may be stored in the memory cell 105. Column decoder 30 may accept data, for example input 35, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state, and re-write (e.g., restore) operations may be performed to return the original logic state to memory cell 105. For example, the capacitors may be partially or completely discharged during a sense operation, corrupting the stored logic state. So the logic state may be re-written after a sense operation. Additionally, activating word lines 12 may result in the discharge of all memory cells in the row. Thus, several or all memory cells 105 in the row may need to be re-written.

The memory controller 40 may control the operation (e.g., read, write, restore, etc.) of memory cells 105 through the various components, such as row decoder 20, column decoder 30, and sense component 25. Memory controller 40 may generate row and column address signals in order to activate the desired word lines 12 and digit lines 15. Memory controller 40 may also generate and control various voltage potentials used during the operation of memory array 10. In general, the amplitude, shape, or duration of an applied voltage discussed herein may be adjusted or varied and may be different for the various operations for operating memory array 10. Furthermore, one, multiple, or all memory cells 105 within memory array 10 may be accessed simultaneously. For example, multiple or all cells of memory array 10 may be accessed simultaneously during a reset operation in which all memory cells 105, or a group of memory cells 105, are set to a single logic state.

Figure 2A:
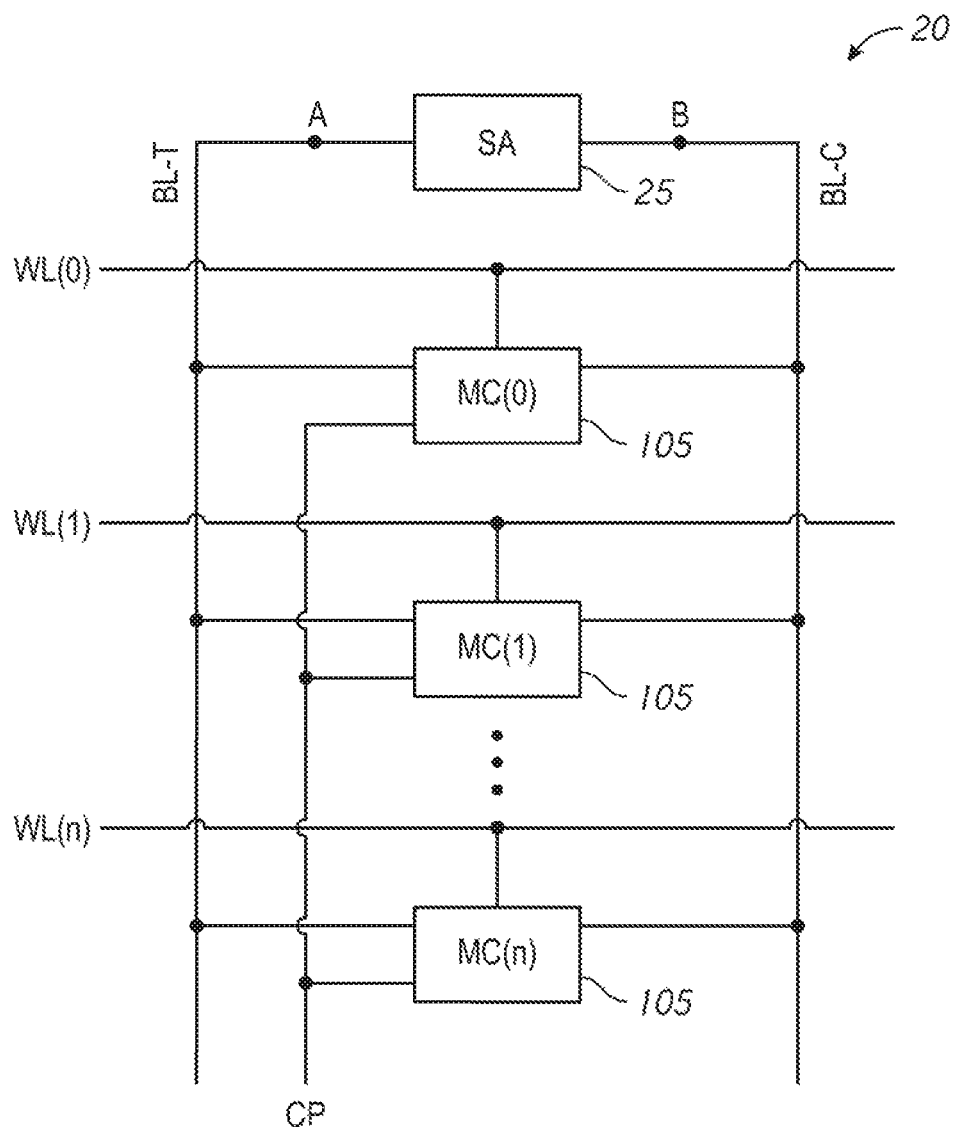
FIG. 2A is a schematic diagram of an example circuit that includes a column of memory cells according to an embodiment of the present disclosure.

FIG. 2A illustrates an example circuit 20 that includes a column of memory cells according to an embodiment of the present disclosure. FIG. 2 illustrates an example circuit 20 that includes memory cells 105 in accordance with various embodiments of the present disclosure. Circuit 20 includes memory cells 105 MC(0)-MC(n), where "n" depends on the array size. The circuit 20 further includes word lines WL(0)-WL(n), digit lines BL-T and BL-C, and sense component 25. The digit line BL-T is coupled to a sense node A of the sense component 25 and the digit line BL-C is coupled to a sense node B of the sense component 25. The word lines, digit lines, and sense component may be examples of memory cells 105, word lines 12, digit lines 15, and sense component 25, respectively, as described with reference to FIG. 1. While one column and n rows of memory cells 105 are shown in FIG. 2A, a memory array may include many columns and rows of memory cells as those shown.

Memory cells 105 may include a logic storage component, such as capacitors and selection components (not shown in FIG. 2A). The capacitors of the memory cells 105 may be ferroelectric capacitors. The ferroelectric capacitors may not discharge upon coupling to digit lines BL-T and BL-C. As previously described, various states may be stored by charging or discharging the capacitors of the memory cell 105. The selection components of memory cell 105 may be activated by a respective word line WL. Each of the memory cells 105 is coupled to a plate line CP that may be used during access of the memory cells 105.

The stored state of a memory cell 105 may be read or sensed by operating various elements represented in circuit 20. Memory cell 105 may be in electronic communication with digit lines BL-T and BL-C. For example, as will be described in more detail below, capacitors of the memory cell 105 can be isolated from digit lines BL-T and BL-C when selection components of the memory cell 105 are deactivated, and the capacitors can be coupled to digit lines BL-T and BL-C when selection components are activated. Activating selection components of the memory cells 105 may be referred to as selecting memory cell 105. In some cases, selection components are transistors and the operation is controlled by applying voltages to the transistor gates, where the voltage magnitude is greater than the threshold voltage of the transistors. Word line WL may activate the selection components. For example, a voltage applied to word line WL is applied to the transistor gate of the selection components of the memory cell 105. As a result, the capacitors of the selected memory cell 105 are coupled to digit lines BL-T and BL-C, respectively. Word lines WL(0)-WL(n) are in electronic communication with selection components of memory cells 105 MC(0)-MC(n), respectively. Thus, activating the word line WL of a respective memory cell 105 may activate the memory cell 105. For example, activating WL(0) activates memory cell MC(0), activating WL(I) activates memory cell MC(1), and so on.

To sense the logic value stored by a memory cell 105, the word line WL may be biased to select a respective memory cell 105, and a voltage may be applied to the plate line CP. Biasing the plate line CP may result in a voltage difference across the capacitors of a memory cell 105, which may yield a change in the stored charge on the capacitors. The magnitude of the change in stored charge may depend on the initial state of each capacitor—e.g., whether the initial state stored corresponded to a logic 1 or a logic 0. When the selection components of the memory cells 105 are activated by the word line WL, the change in stored charge due to biasing the plate line CP may cause a change in the voltages of digit lines BL-T and BL-C based on the charge stored on the capacitors of the memory cell 105. The change in the voltage of digit lines BL-T and BL-C may cause a change on sense nodes A and B of the sense component 25, respectively. The resulting voltage of digit lines BL-T and BL-C may be compared to one another by the sense component 25 in order to determine the logic value represented by the stored state of each memory cell 105.

Sense component 25 may include various transistors or amplifiers to detect and amplify a difference in signals, which may include latching the amplified difference. Sense component 25 may include a sense amplifier that receives and compares the voltage of its sense nodes (e.g., sense nodes A and B). The voltages of the sense nodes A and B may be affected by the voltages of the digit lines BL-T and BL-C, respectively. The sense amplifier output (e.g., sense node A) may be driven to a higher (e.g., a positive) or lower (e.g., negative or ground) supply voltage based on the comparison. The other sense node (e.g., sense node B) may be driven to a complementary voltage (e.g., the positive supply voltage is complementary to the negative or ground voltage, and the negative or ground voltage is complementary to the positive supply voltage). For instance, if the sense node A has a higher voltage than sense node B, then the sense amplifier may drive the sense node A to a positive supply voltage and drive the sense node B to a negative or ground voltage. Sense component 25 may latch the state of the sense amplifier (e.g., voltages of sense node A and/or sense node B and/or the voltages of digit lines BL-T and BL-C), which may be used to determine the stored state and logic value of memory cell 105, logic 1. Alternatively, if the sense node A has a lower voltage than sense node B, the sense amplifier may drive the sense node A to a negative or ground voltage and drive the sense node B to a positive supply voltage. Sense component 25 may also latch the sense amplifier state for determining the stored state and the logic value of memory cell 105, e.g., logic 0.

The stored state may represent a logic value of memory cell 105, which may then be output, for example, through column decoder 30 as output 35 with reference to FIG. 1. In embodiments where the sense component 25 also drives the digit lines BL-T and BL-C to complementary voltages, the complementary voltages may be applied to the memory cell 105 to restore the original data state read. By restoring the data, a separate restore operation is unnecessary.

Figure 2B:
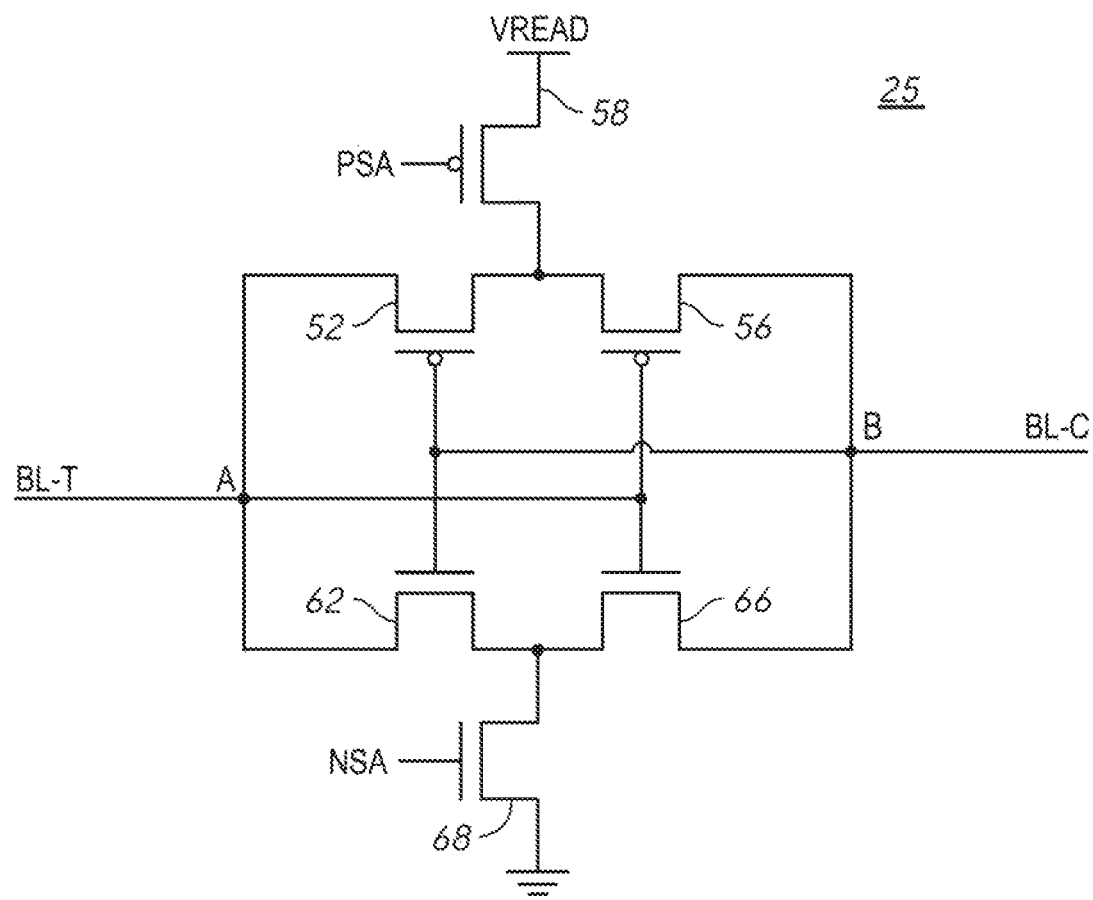
FIG. 2B is a schematic diagram of a sense component according to an embodiment of the disclosure.

FIG. 2B illustrates a sense component 25 according to an embodiment of the disclosure. The sense component 25 includes p-type field effect transistors 52 and 56 and n-type field effect transistors 62 and 66. Gates of the transistor 56 and transistor 66 are coupled to sense node A. Gates of the transistor 52 and transistor 62 are coupled to sense node B. The transistors 52 and 56, and the transistors 62 and 66 represent a sense amplifier. A p-type field effect transistor 58 is configured to be coupled to a power supply (e.g., VREAD voltage power supply) and is coupled to a common node of the transistors 52 and 56. The transistor 58 is activated by an active PSA signal (e.g., active low logic). An n-type field effect transistor 68 is configured to be coupled to a sense amplifier reference voltage (e.g., ground) and is coupled to a common node of the transistors 62 and 66. The transistor 68 is activated by an active NSA signal (e.g., active high logic).

In operation, the sense amplifier is activated by activating the PSA and NSA signals to couple the sense amplifier to the voltage of the power supply and the sense amplifier reference voltage. When activated, the sense amplifier compares the voltages of sense nodes A and B, and amplifies a voltage difference by driving the sense nodes A and B to complementary voltage levels (e.g., driving sense node A to VREAD and sense node B to ground, or driving sense node A to ground and sense node B to VREAD). When the sense nodes A and B have been driven to the complementary voltage levels, the voltages of sense nodes A and B are latched by the sense amplifier and remain latched until the sense amplifier is deactivated.

With reference to FIG. 2A, to write memory cell 105, a voltage may be applied across the capacitors of the memory cell 105. Various methods may be used. In some examples, selection components may be activated through word lines WL, respectively, in order to couple the capacitors to digit lines BL-T and BL-C. For ferroelectric capacitors, a voltage may be applied across capacitors of the memory cell 105 by controlling the voltage of digit lines BL-T and BL-C to apply a positive or negative voltage across the capacitors. In some embodiments, a complementary voltage is applied to the capacitors of the memory cell 105 to write the memory cell 105, for example, using the digit lines BL-T and BL-C, and plate line CP. As a non-limiting example, in some embodiments, to write a first logic value to the memory cell 105 a first voltage is applied to one plate of the capacitors and a second voltage complementary to the first voltage is applied to the other plate of the capacitors, and to write a second logic value to the memory cell 105 the second voltage is applied to the one plate of the capacitors and the first voltage is applied to the other plate of the capacitors.

In some examples, a restore operation may be performed after sensing. As previously discussed, the sense operation may degrade or destroy the originally stored state of the memory cell 105. After sensing, the state may be written back to the memory cell 105. For example, sense component 25 may determine the stored state of memory cell 105 and may then write the same state back, for example, through the digit lines BL-T and BL-C.

Figure 3A:
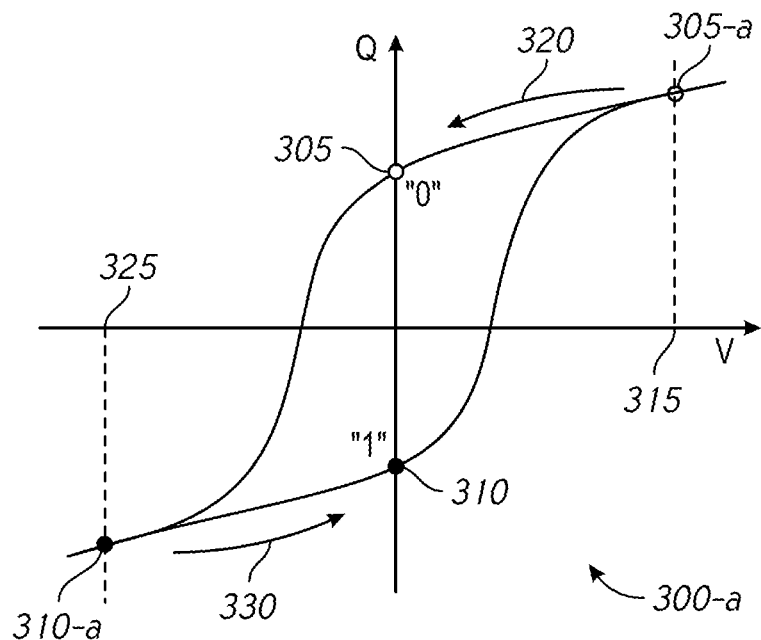
FIG. 3A and FIG. 3B are diagrams of example non-linear electrical properties for a ferroelectric memory cell in accordance with various embodiments of the present disclosure.
Figure 3B:
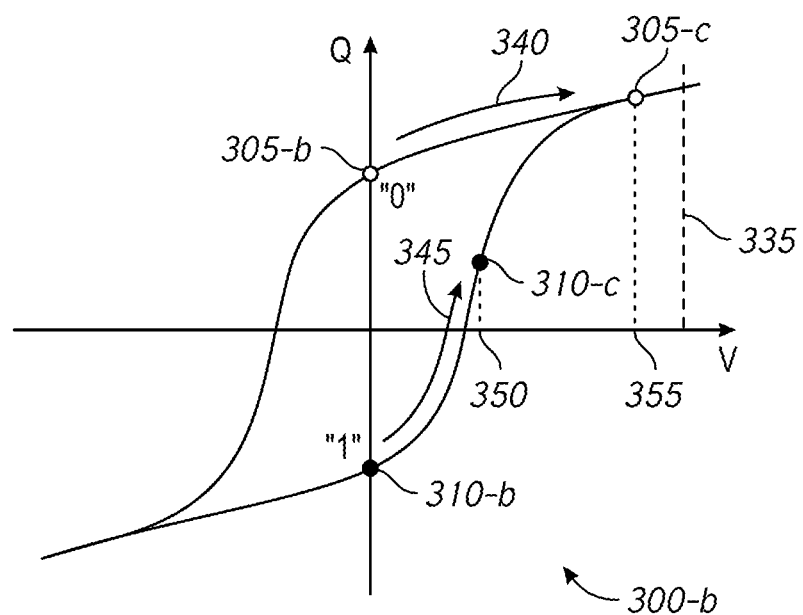

Ferroelectric materials have non-linear polarization properties. FIG. 3A and FIG. 3B illustrate examples of non-linear electrical properties with hysteresis curves 300-a (FIG. 3A) and 300-b (FIG. 3B) for a memory cell for ferroelectric memory in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 105 of FIGS. 1 and 2A) as a function of a voltage difference, V.

A ferroelectric material is characterized by a spontaneous electric polarization, for example, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in volatile memory arrays. This may reduce the need to perform refresh operations as described above for some volatile memory architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question and maintaining the second terminal at ground (or approximately zero volts (0V)). A negative voltage may be applied by maintaining the terminal in question at ground and applying a positive voltage to the second terminal, for example, positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed without loss of understanding.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, which is the polarization (or charge) that remains upon removing the external bias (e.g., voltage).

To read, or sense, the stored state of the ferroelectric capacitor, a voltage may be applied across the capacitor. In response, the stored charge, Q, changes, and the degree of the change depends on the initial charge state, and as a result, the final stored charge (Q) depends on whether charge state 305-b or 310-b was initially stored. For example, hysteresis curve 300-b illustrates two possible stored charge states 305-b and 310-b. Voltage 335 may be applied across the capacitor as previously discussed. Although depicted as a positive voltage, voltage 335 may be negative. In response to voltage 335, charge state 305-b may follow path 340.

Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line coupled to the memory cell. For example, if the capacitor is coupled to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis. Charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355 (e.g., voltage 335–voltage 350) or (e.g., voltage 335–voltage 355). A reference voltage may be generated such that its magnitude is between the two possible digit line voltages in order to determine the stored logic state, for example, if the digit line voltage is higher or lower than the reference voltage. For example, the reference voltage may be an average of the two quantities (voltage 335–voltage 350) and (voltage 335–voltage 355). In another example, the reference voltage may be provided by isolating a voltage on first sense node of a sense component, then causing a voltage change on a second sense node of the sense component through a digit line, and comparing the resulting voltage of the second sense node with the isolated voltage of the first sense node. Upon comparison by the sense component, the sensed digit line voltage may be determined to be higher or lower than the reference voltage, and the stored logic value of the ferroelectric memory cell (e.g., a logic 0 or 1) may be determined.

Figure 4A:
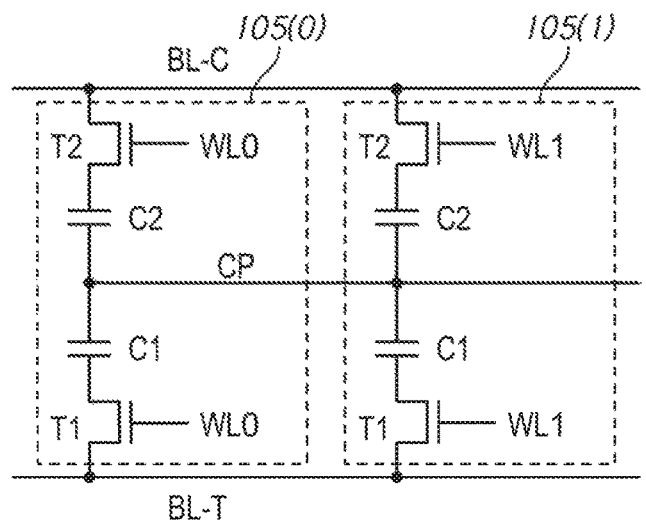
FIG. 4A is a schematic diagram of example memory cells including two transistors and two capacitors according to an embodiment of the disclosure.

FIG. 4A is a schematic diagram of two memory cells 105(0) and 105(1) according to an embodiment of the disclosure. A dashed line demarcates an approximate boundary of the memory cell 105. Each of the memory cells 105 includes two selection components T1 and T2 and two capacitors C1 and C2. The capacitors C1 and C2 may be ferroelectric capacitors. The selection components T1 and T2 may be transistors, for example, n-type field effect transistors. In such an example, each of the memory cells 105 includes two transistors and two capacitors (e.g., 2T2C).

Operation of the selection components T1 and T2 is controlled by applying voltages to the transistor gates. A respective word line WL may activate the selection components (e.g., WL0 may activate the selection components T1 and T2 of memory cell 105(0), and WL1 may activate the selection components T1 and T2 of memory cell 105(1)).

The capacitor C1 has a first plate coupled to a plate line CP and has a second plate. The capacitor C2 has a first plate coupled to the plate line CP and has a second plate. The second plate of the capacitor C1 is coupled to the selection component T1 and the second plate of the capacitor C2 is coupled to the selection component T2. The selection component T1 is further coupled to a digit line BL-T and the selection component T2 is further coupled to a digit line BL-C. When activated, such as by respective word line WL, the second plate of the capacitor C1 and the second plate of the capacitor C2 are coupled to the digit lines BL-T and BL-C, respectively. As previously discussed, when coupled to the digit lines BL-T and BL-C, the memory cells 105 may be accessed. For example, a stored state of the memory cells 105 may be read and/or the memory cells 105 may be written to store a new state or the same state. Various voltages, for example, complementary voltages in some embodiments, may be applied to the plates of the capacitor C1 and C2 over the digit lines BL-T and BL-C and the plate line CP to access (e.g., read and/or write) the memory cells 105.

Figure 4B:
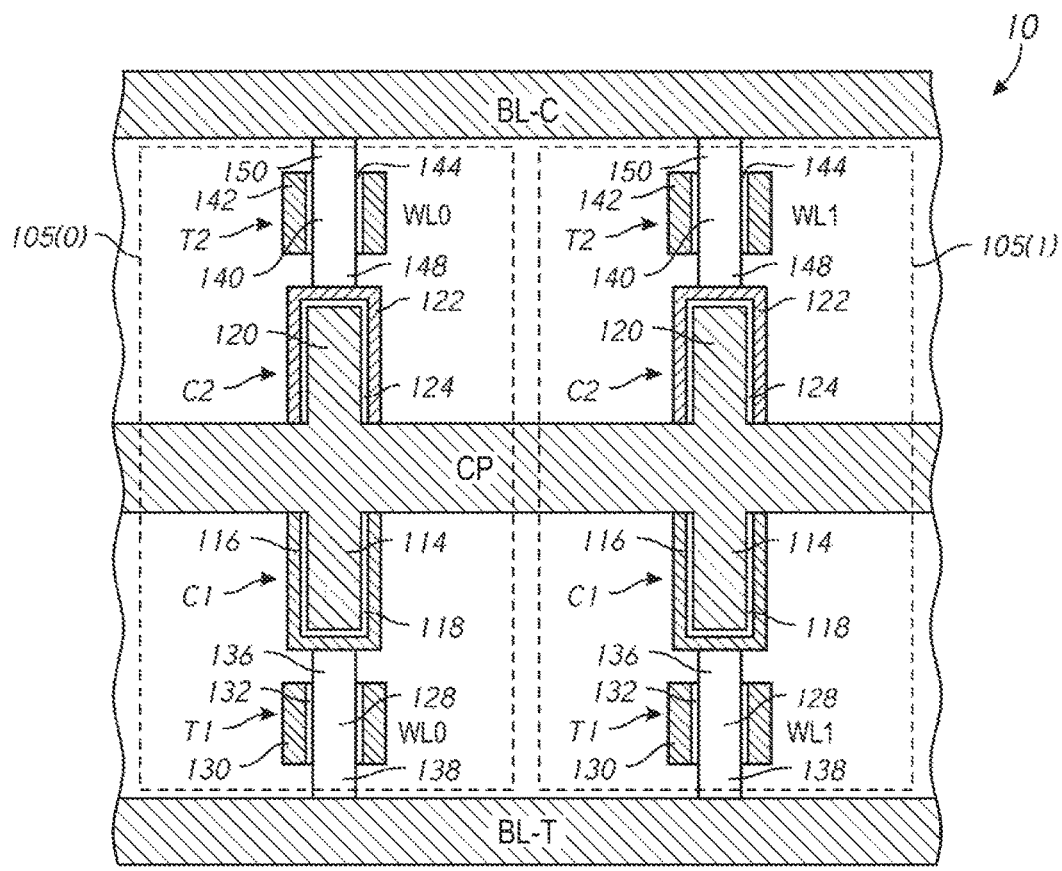
FIG. 4B is a diagrammatic cross-sectional side view of a region of an example memory array showing example memory cells including two transistors and two capacitors according to an embodiment of the disclosure.

FIG. 4B shows a region of a memory array 10 including example memory cells 105(0) and 105(1) of FIG. 4A according to an embodiment of the disclosure. In the embodiment of FIG. 4B, the memory cells 105(0) and 105(1) are laterally displaced relative to one another. A dashed line demarcates an approximate boundary of a memory cell 105. In some embodiments the configuration of the memory cells 105 may be considered to comprise memory cells within a $4F^2$ architecture, where F indicates a minimum feature size of a given technology The illustrated portion of memory array 10 is supported by a base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base may correspond to a semiconductor substrate containing one or more materials associated with integrated circuit fabrication. Such materials may include, for example, one or more of refractory metal materials, barrier materials, diffusion materials, insulator materials, etc.

The adjacent memory cells 105(0) and 105(1) are in a common column as one another within the memory array. The memory cells 105(0) and 105(1) are shown along digit lines BL-T and BL-C. The digit lines BL-T and BL-C may be coupled with a sense component 25 of the type described above with reference to FIGS. 1 and 2.

The memory cell 105(0) comprises first and second transistors T1 and T2, and comprises first and second capacitors C1 and C2 between the first and second transistors. The first capacitor C1 comprises a first plate 114, a second plate 116, and a ferroelectric material 118 between the first and second plates 114 and 116. Similarly, the second capacitor C2 comprises a first plate 120, a second plate 122, and a ferroelectric material 124 between the first and second plates 120 and 122.

In the shown embodiment the second plates 116 and 122 are container-shaped outer plates, and the first plates 114 and 120 are inner plates which extend into the container-shaped outer plates. In other embodiments the second plates 116 and 122 may have other configurations, and the first plates 114 and 120 may also have other configurations.

The first plates 114 and 120 are coupled with a plate line structure CP. In the illustrated embodiment the first plates 114 and 120 share a common composition with the plate line structure CP. In other embodiments the plate line structure CP may comprise a different composition as compared to the first plates 114 and 120.

The first and second capacitors, C1 and C2, are vertically displaced relative to one another, with the second capacitor C2 being above the first capacitor C1. The first transistor T1 is between the first capacitor C1 and the digit line BL-T and is vertically displaced relative to the first capacitor C1, and the second transistor T2 is between the second capacitor C2 and the digit line BL-C and is vertically displaced relative to the second capacitor C2.

In the shown embodiment a first semiconductor pillar 128 extends upwardly from the digit line BL-T to the second plate 116 of the first capacitor C1, and the first transistor T1 is along such first semiconductor pillar. The first transistor T1 has a conductive transistor gate 130 which is spaced from the semiconductor pillar 128 by gate dielectric material 132. The first transistor T1 has a channel region within semiconductor pillar 128 and along the gate dielectric material 132, and has source/drain regions 136 and 138 within the semiconductor pillar and on opposing sides of the channel region. The source/drain region 136 is coupled with the second plate 116 of the first capacitor C1, and the source/drain region 138 is coupled with the digit line BL-T. In the shown embodiment the source/drain region 136 extends to the second plate 116 of the first capacitor C1. In other embodiments the source/drain region 136 may extend to an electrical interconnect which in turn extends to the second plate 116 of the first capacitor C1. Also, in the shown embodiment the source/drain 138 extends to the digit line BL-T. In other embodiments the source/drain region 138 may extend to an electrical interconnect which in turn extends to the digit line BL-T.

A second semiconductor pillar 140 extends downwardly from the digit line BL-C to the second plate 122 of the second capacitor C2, and the second transistor T2 is along such second semiconductor pillar. The second transistor T2 has a second conductive transistor gate 142 which is spaced from the semiconductor pillar 140 by gate dielectric material 144. The second transistor T2 has a second channel region within the semiconductor pillar 140 and along the gate dielectric material 144, and has source/drain regions 148 and 150 within the semiconductor pillar and on opposing sides of the channel region. The source/drain region 148 is coupled with the second plate 122 of second capacitor C2, and the source/drain region 150 is coupled with the digit line BL-C. In the shown embodiment the source/drain region 148 extends to the second plate 122 of the second capacitor C2. In other embodiments the source/drain region 148 may extend to an electrical interconnect which in turn extends to the second plate 122 of the second capacitor C2. Also, in the shown embodiment the source/drain region 150 extends to the digit line BL-C. In other embodiments the source/drain region 150 may extend to an electrical interconnect which in turn extends to the digit line BL-C.

The conductive gates 130 and 142 of the first and second transistors T1 and T2 are coupled with a first word line WL0. Such first word line may extend in and out of the page relative to the cross-section section of FIG. 4B.

The memory cells 105(0) and 105(1) are substantially identical to one another, with the term "substantially identical" meaning that the memory cells are identical to within reasonable tolerances of fabrication and measurement. The memory cell 105(1) comprises first and second capacitors C1 and C2 together with first and second transistors T1 and T2. The first and second transistors T1 and T2 comprise conductive gates 130 and 142 which are coupled with a second word line WL1. Accordingly, the second memory cell 105(1) is along a different row (i.e. word line) than the memory cell 105(0) within the memory array 10.

In the illustrated embodiment of FIG. 4B the plate line structure CP is a rail extending horizontally along the column defined by the digit lines BL-T and BL-C. Such rail is shared by the memory cells 105(0) and 105(1), as well as by all other memory cells along such column. In other embodiments the plate line structure CP may be subdivided into a plurality of separate structures.

In the illustrated embodiments of FIG. 4B the first and second transistors T1 and T2 of the memory cell 105(0) are vertically displaced relative to one another, as are the first and second capacitors C1 and C2. Further, the first and second capacitors C1 and C2, and first and second transistors T and T2, are in a common vertical plane as one another (i.e., are vertically stacked one atop another). In other embodiments the first and second capacitors C1 and C2, and/or first and second transistors T1 and T2, may be provided in different configurations.

Figure 5A:
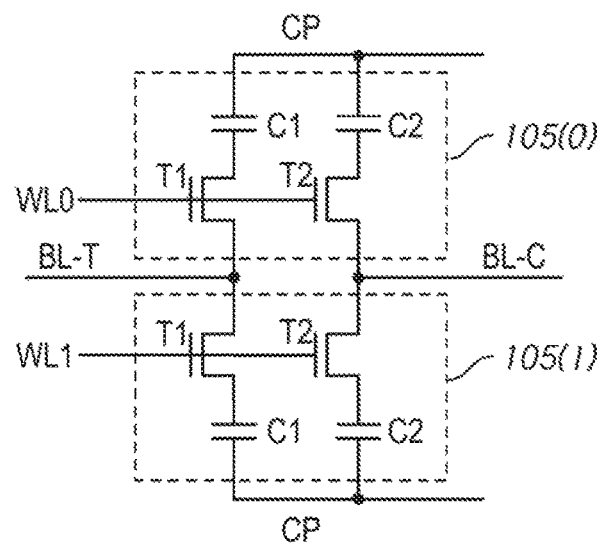
FIG. 5A is a schematic diagram of example memory cells including two transistors and two capacitors according to an embodiment of the disclosure.

FIG. 5A is a schematic diagram of two memory cells 105(0) and 105(1) according to an embodiment of the disclosure. A dashed line demarcates an approximate boundary of the memory cell 105. Each of the memory cells 105 includes two selection components T1 and T2 and two capacitors C1 and C2. The capacitors C1 and C2 may be ferroelectric capacitors. The selection components T1 and T2 may be transistors, for example, n-type field effect transistors. In such an example, each of the memory cells 105 includes two transistors and two capacitors (e.g., 2T2C).

Operation of the selection components T1 and T2 is controlled by applying voltages to the transistor gates. A respective word line WL may activate the selection components (e.g., WL0 may activate the selection components T1 and T2 of memory cell 105(0), and WL1 may activate the selection components T1 and T2 of memory cell 105(1)).

The capacitor C1 has a first plate coupled to a plate line CP and has a second plate. The capacitor C2 has a first plate 120 coupled to the plate line CP and a second plate. The second plate of the capacitor C1 is coupled to the selection component T1 and the second plate of the capacitor C2 is coupled to the selection component T2. The selection component T1 is further coupled to a digit line BL-T and the selection component T2 is further coupled to a digit line BL-C. When activated, such as by respective word line WL, the second plate of the capacitor C1 and the second plate of the capacitor C2 are coupled to the digit lines BL-T and BL-C, respectively. As previously discussed, when coupled to the digit lines BL-T and BL-C, the memory cells 105 may be accessed. For example, a stored state of the memory cells 105 may be read and/or the memory cells 105 may be written to store a new state or the same state. Various voltages, for example, complementary voltages in some embodiments, may be applied to the plates of the capacitor C1 and C2 over the digit lines BL-T and BL-C and the plate line CP to access (e.g., read and/or write) the memory cells 105.

Figure 5B:
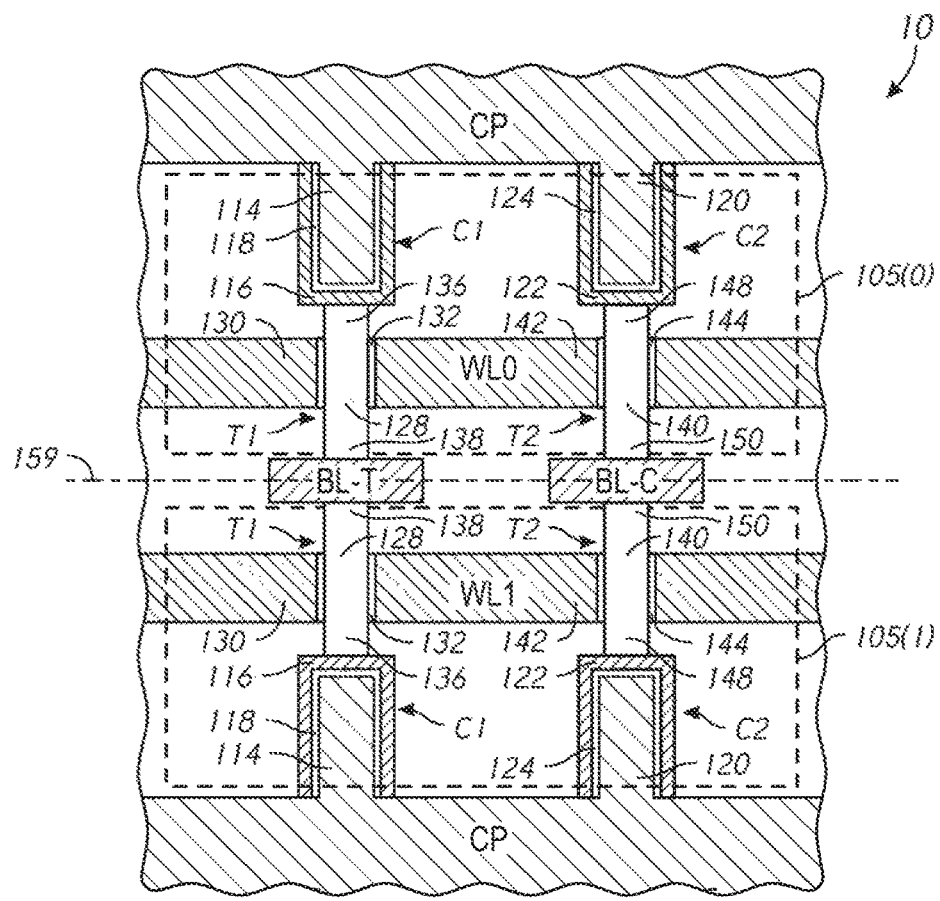
FIG. 5B is a diagrammatic cross-sectional side view of a region of an example memory array showing example memory cells including two transistors and two capacitors according to an embodiment of the disclosure.

FIG. 5B shows a portion of a memory array 10 including example memory cells 105(0) and 105(1) of FIG. 5A according to an embodiment of the disclosure. In the embodiment of FIG. 5B, the memory cell 105(0) is vertically stacked over the memory cell 105(1). A dashed line demarcates an approximate boundary of the memory cells 105(0) and 105(1). In contrast to the memory cells 105(0) and 105(1) of FIG. 4A, which in some embodiments comprise memory cells within a $4F^2$ architecture, in some embodiments the memory cells 105 of FIG. 5A may be considered to comprise memory cells within an $8F^2$ architecture, where F indicates a minimum features size of a given technology.

The illustrated portion of memory array 10 may be supported by a base (not shown) analogous to the base of FIG. 4B. The memory cells 105(0) and 105(1) are in a common column as one another within the memory array. Digit lines BL-T and BL-C are between the memory cells 105(0) and 105(1), and extend in and out of the page relative to the cross-section of FIG. 5B. The digit lines BL-T and BL-C may be coupled with a sense component 25 of the type previously described with reference to FIGS. 1 and 2. The digit lines BL-T and BL-C are shared by the memory cells 105(0) and 105(1).

The memory cell 105(0) comprises first and second transistors T1 and T2 which are laterally displaced relative to one another. The memory cell 105(0) comprises the first capacitor C1 above the first transistor T1, and comprises the second capacitor C2 above the second transistor T2. The first transistor T1 is vertically displaced relative to the first capacitor C1 and the second transistor T2 is vertically displaced relative to the second capacitor C2. The first capacitor C1 comprises a first plate 114, a second plate 116, and ferroelectric material 118 between the first and second plates 114 and 116. The second capacitor C2 comprises a first plate 120, a second plate 122, and ferroelectric material 124 between the first and second plates 120 and 122.

In the shown embodiment the second plates 116 and 122 are container-shaped outer plates, and the first plates 114 and 120 are inner plates which extend into the container-shaped outer plates. In other embodiments the second plates 116 and 122 may have other configurations, and the first plates 114 and 120 may also have other configurations.

The first plates 114 and 120 are coupled with a plate line structure CP provided above the first and second capacitors C1 and C2 of the memory cell 105(0). In the illustrated embodiment the first plates 114 and 120 share a common composition with the plate line structure CP. In other embodiments the plate line structure CP may comprise a different composition as compared to the first plates 114 and 120.

The first and second capacitors C1 and C2 are laterally displaced relative to one another, and in the shown embodiment are in a same horizontal plane as one another (i.e., are horizontally aligned with one another). The first transistor T1 is between the first capacitor C1 and the digit line BL-T, and the second transistor T2 is between the second capacitor C2 and the digit line BL-C. In the shown embodiment the first and second transistors T1 and T2 are in a common horizontal plane as one another, and the word line WL0 extends along such horizontal plane and comprises the gates 130 and 142 of the first and second transistors T1 and T2.

A first semiconductor pillar 128 extends upwardly from the digit line BL-T to the second plate 116 of the first capacitor C1, and the first transistor T1 is along such first semiconductor pillar. A second semiconductor pillar 140 extends upwardly from the digit line BL-C to the second plate 122 of the second capacitor C2, and the second transistor T2 is along the second semiconductor pillar 140.

The first transistor T1 includes the gate dielectric material 132, and further includes the first channel region within the semiconductor pillar 128 and along the gate dielectric material 132, and source/drain regions 136 and 138 within the semiconductor pillar and on opposing sides of the channel region. The source/drain region 136 is coupled with the second plate 116 of first capacitor C1, and the source/drain region 138 is coupled with the digit line BL-T. The second transistor T2 includes the gate dielectric material 144, and further includes the second channel region within the semiconductor pillar 140 and along the gate dielectric material 144, and source/drain regions 148 and 150 within the semiconductor pillar and on opposing sides of the channel region. The source/drain region 148 is coupled with the second plate 122 of second capacitor C2, and the source/drain region 150 is coupled with the digit line BL-C.

The memory cell 105(1) similar to memory cell 105(0), and comprises first and second capacitors C1 and C2 together with first and second transistors T1 and T2. The first and second transistors T1 and T2 comprise conductive gates 130 and 142 which are coupled with a second word line WL1. The first plates 114 and 120 of the first and second capacitors C1 and C2 are coupled with the plate line structure CP provided beneath the capacitors C1 and C2.

The memory cell 105(1) comprises first and second transistors T1 and T2 which are laterally displaced relative to one another. The memory cell 105(1) comprises the first capacitor C1 below the first transistor T1, and comprises the second capacitor C2 below the second transistor T2. The first capacitor C1 comprises a first plate 114, a second plate 116, and ferroelectric material 118 between the first and second plates 114 and 116. The second capacitor C2 comprises a first plate 120, a second plate 122, and ferroelectric material 124 between the first and second plates 120 and 122.

In the illustrated embodiment the digit line BL-T and BL-C are in a common horizontal plane as one another. An axis 159 extending through the digit lines BL-T and BL-C may be considered to define a mirror plane. The memory cell 105(1) may be considered to be a substantially mirror image of the memory cell 105(0) across the mirror plane. The term "substantially mirror image" is utilized to indicate that the memory cell 105(1) may be a mirror image of the memory cell 105(0) to within reasonable tolerances of fabrication and measurement.

Figure 6A:
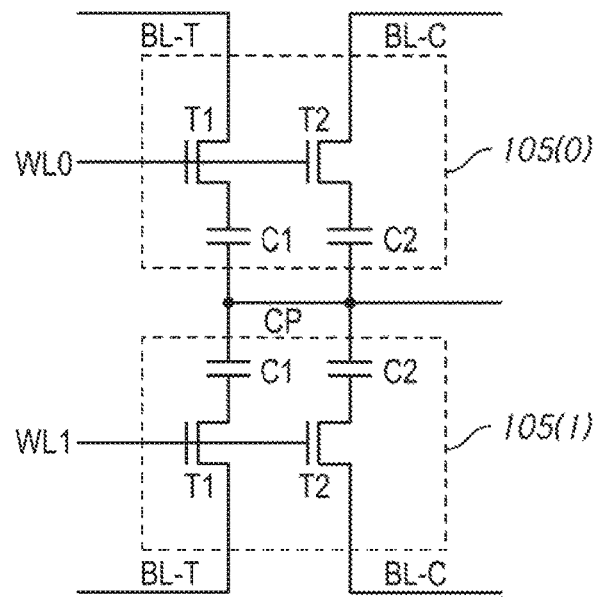
FIG. 6A is a schematic diagram of example memory cells including two transistors and two capacitors according to an embodiment of the disclosure.
Figure 6B:
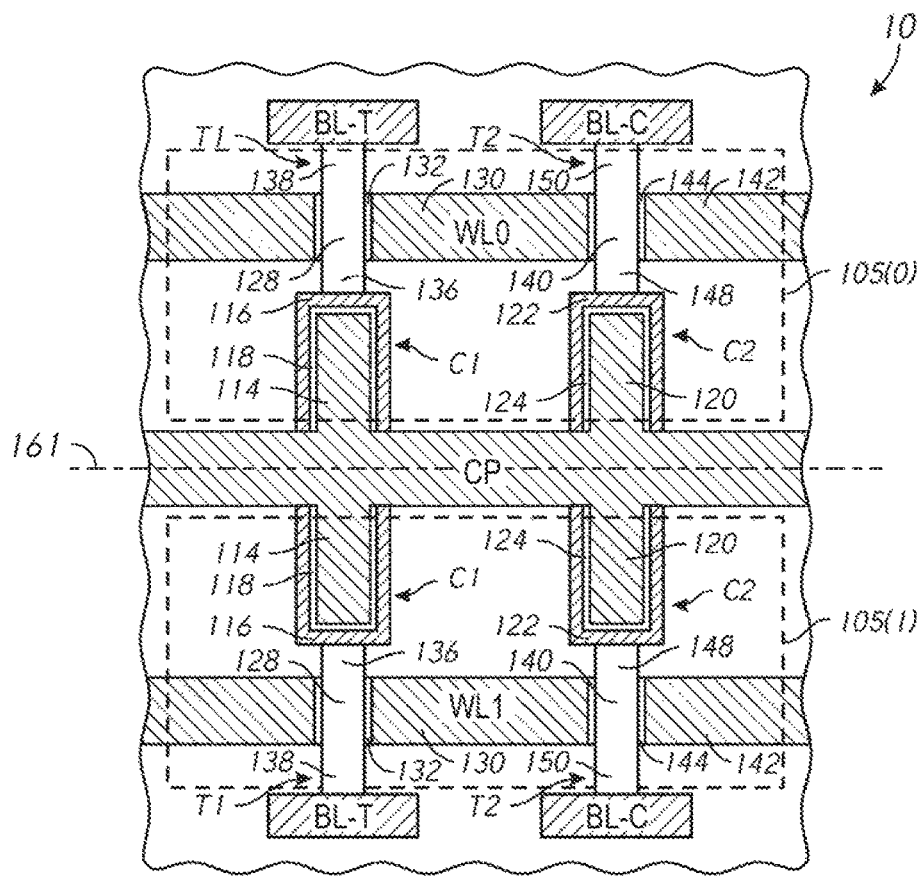
FIG. 6B is a diagrammatic cross-sectional side view of a region of an example memory array showing example memory cells including two transistors and two capacitors according to an embodiment of the disclosure.

In the illustrated embodiment of FIG. 5B the digit lines BL-T and BL-C are shared by the memory cells 105(0) and 105(1). In other embodiments a plate line structure CP may be shared by memory cells 105(0) and 105(1) which are vertically displaced on opposing sides of the plate line structure CP from one another. FIGS. 6A and 6B illustrate an example of such other embodiments.

FIG. 6A is a schematic diagram of two memory cells 105(0) and 105(1) according to an embodiment of the disclosure. A dashed line demarcates an approximate boundary of the memory cells 105. Each of the memory cells 105 includes two selection components T1 and T2 and two capacitors C1 and C2. The capacitors C1 and C2 may be ferroelectric capacitors. The selection components T1 and T2 may be transistors, for example, n-type field effect transistors. In such an example, each of the memory cells 105 includes two transistors and two capacitors (e.g., 2T2C). The memory cells 105(0) and 105(1) of FIG. 6A share a plate line structure CP and are coupled to different digit lines BL-T and different digit lines BL-C. In contrast, the memory cells 105(0) and 105(1) of FIG. 5A share digit lines BL-T and share digit lines BL-C and are coupled to different plate lines CP.

Operation of the memory cells 105(0) and 105(1) of FIG. 6A is similar to the operation of the memory cells 105(0) and 105(1) of FIG. 5A previously described, and will not be repeated in the interest of brevity.

FIG. 6B shows a portion of a memory array 10 comprising a pair of memory cells 105(0) and 105(1) of FIG. 6A according to an embodiment of the disclosure. In the embodiment of FIG. 6B, the memory cell 105(0) is vertically stacked over the memory cell 105(1). A dashed line demarcates an approximate boundary of the memory cells 105(0) and 105(1). In some embodiments the memory cells 105 of FIG. 6B may be considered to comprise memory cells within a 8F² architecture, where F indicates a minimum features size of a given technology. In contrast to the memory cells of FIG. 5B, the memory cells 105(0) and 105(1) of FIG. 6B share a plate line structure CP and are coupled to different digit lines BL-T and different digit lines BL-C.

The illustrated portion of memory array 10 may be supported by a base (not shown) analogous to the base of FIG. 4B. The memory cells 105(0) and 105(1) are in a common column as one another within the memory array. A horizontally-extending rail is between the memory cells 105(0) and 105(1), and extends along the cross-section of FIG. 6B. The rail is a plate line structure CP that is shared by the memory cells 105(0) and 105(1). Digit lines BL-T and BL-C are between the memory cells 105(0) and 105(1), and extend in and out of the page relative to the cross-section of FIG. 5B. The digit lines BL-T and BL-C may be coupled with a sense component 25 of the type previously described with reference to FIGS. 1 and 2.

The memory cell 105(0) comprises first and second transistors T1 and T2 which are laterally displaced relative to one another. The memory cell 105(0) comprises a first capacitor C1 below the first transistor T1, and comprises a second capacitor C2 below the second transistor T2. The first capacitor C1 comprises a first plate 114, a second plate 116, and ferroelectric material 118 between the first and second plates 114 and 116. The second capacitor C2 comprises a first plate 120, a second plate 122, and ferroelectric material 124 between the first and second plates 120 and 122.

The first plates 114 and 120 are coupled with the plate line structure CP. In the illustrated embodiment the first plates 114 and 120 share a common composition with the plate line structure CP. In other embodiments the plate line structure CP may comprise a different composition as compared to the first plates 114 and 120.

The first and second capacitors C1 and C2 are laterally displaced relative to one another, with the second capacitor C2 being in a same horizontal plane as the first capacitor C1. The first transistor T1 is between the first capacitor C1 and a digit line BL-T, and the second transistor T2 is between the second capacitor C2 and a digit line BL-C. The digit lines BL-T and BL-C extend in and out of the page relative to the cross-section of FIG. 6B. In the shown embodiment the first and second transistors T1 and T2 are in a common horizontal plane as one another, and the word line WL0 extends along such horizontal plane and comprises the gates 130 and 142 of the first and second transistors T1 and T2.

A first semiconductor pillar 128 extends downwardly from the digit line BL-T to the second plate 116 of the first capacitor C1, and the first transistor T1 is along such first semiconductor pillar. A second semiconductor pillar 140 extends downwardly from the digit line BL-C to the second plate 122 of the second capacitor C2, and the second transistor T2 is along such second semiconductor pillar.

The first transistor T1 includes the gate dielectric material 132, and further includes the first channel region within the semiconductor pillar 128 and along the gate dielectric material 132, and the source/drain regions 136 and 138 within the semiconductor pillar and on opposing sides of the channel region. The source/drain region 136 is coupled with the second plate 116 of first capacitor C1, and the source/drain region 138 is coupled with the digit line BL-T. The transistor T2 includes the gate dielectric material 144, the second channel region, and the source/drain regions 148 and 150. The source/drain region 148 is coupled with the second plate 122 of second capacitor C2, and the source/drain region 150 is coupled with the digit line BL-C.

The memory cell 105(1) is similar to memory cell 105(0), and comprises first and second capacitors C1 and C2 together with first and second transistors T1 and T2. The first and second transistors T1 and T2 comprise conductive gates 130 and 142 which are coupled with a second word line WL1. The first plates 114 and 120 of the first and second capacitors C1 and C2 in memory cell 105(1) are coupled with the plate line structure CP provided above the capacitors C1 and C2.

An axis 161 extending along the plate line structure CP may be considered to define a mirror plane. The memory cell 105(1) may be considered to be a substantially mirror image of the memory cell 105(0) across the mirror plane. The term "substantially mirror image" is utilized to indicate that the memory cell 105(1) may be a mirror image of the memory cell 105(0) to within reasonable tolerances of fabrication and measurement. In comparison to the memory cells 105(0) and 105(1) previously discussed with reference to FIG. 5B, the memory cells 105(0) and 105(1) of the illustrated embodiments of FIG. 6B are mirrored with respect to the plate line structure CP whereas the memory cells 105(0) and 105(1) of FIG. 5B are mirrored with respect to the digit lines BL-T and BL-C.

In the illustrated embodiment of FIG. 6B the digit line BL-T of memory cell 105(0) (i.e., the digit line BL-T above word line WL0) and the digit line BL-T of memory cell 105(1) (i.e., the digit line BL-T below word line WL1) are coupled to one another. The digit line BL-C of memory cell 105(0) (i.e., the digit line BL-C above word line WL0) and the digit line BL-C of memory cell 105(1) (i.e., the digit line BL-C below word line WL1) are coupled to one another. Electrical properties of the coupled digit lines BL-T are compared with those of the coupled digit lines BL-C with the sense component 25 of the type described above with reference to FIGS. 1 and 2.

Figure 7A:
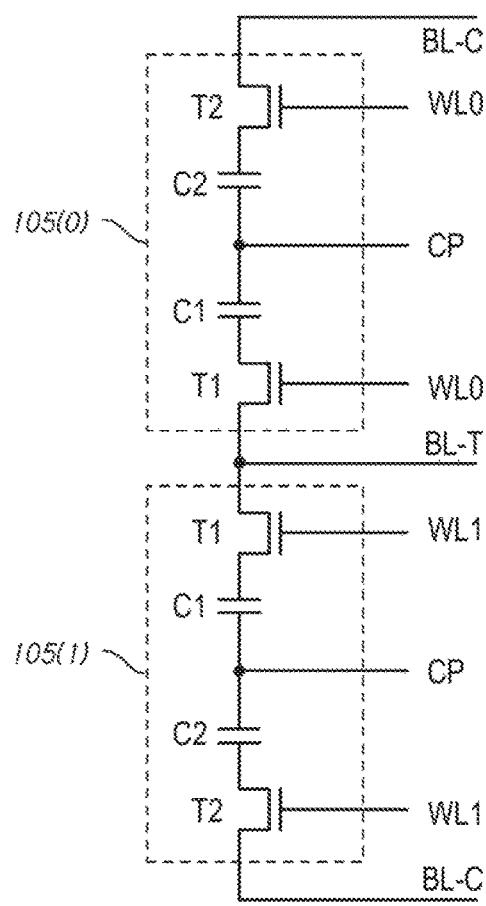
FIG. 7A is a schematic diagram of example memory cells including two transistors and two capacitors according to an embodiment of the disclosure.

FIG. 7A is a schematic diagram of two memory cells 105(0) and 105(1) according to an embodiment of the disclosure. A dashed line demarcates an approximate boundary of the memory cell 105. Each of the memory cells 105 includes two selection components T1 and T2 and two capacitors C1 and C2. The capacitors C1 and C2 may be ferroelectric capacitors. The selection components T1 and T2 may be transistors, for example, n-type field effect transistors. In such an example, each of the memory cells 105 includes two transistors and two capacitors (e.g., 2T2C).

A respective word line WL may activate the selection components (e.g., WL0 may activate the selection components T1 and T2 of memory cell 105(0) and WL1 may activate the selection components T1 and T2 of memory cell 105(1)). The capacitor C1 has a first plate coupled to a plate line CP and has a second plate. The capacitor C2 has a first plate coupled to the plate line CP and has a second plate. The second plate of the capacitor C1 is coupled to the selection component T1 and the second plate of the capacitor C2 is coupled to the selection component T2. The selection component T1 is further coupled to a digit line BL-T and the selection component T2 is further coupled to a digit line BL-C. The memory cells 105(0) and 105(1) are coupled to a shared digit line BL-T and coupled to different digit lines BL-C. When activated, such as by respective word line WL, the second plate of the capacitor C1 and the second plate of the capacitor C2 are coupled to the digit lines BL-T and BL-C, respectively. As previously discussed, when coupled to the digit lines BL-T and BL-C, the memory cells 105 may be accessed. For example, a stored state of the memory cells

105 may be read and/or the memory cells 105 may be written to store a new state or the same state. Various voltages, for example, complementary voltages in some embodiments, may be applied to the plates of the capacitor C1 and C2 over the digit lines BL-T and BL-C and the plate line CP to access (e.g., read and/or write) the memory cells 105.

Figure 7B:
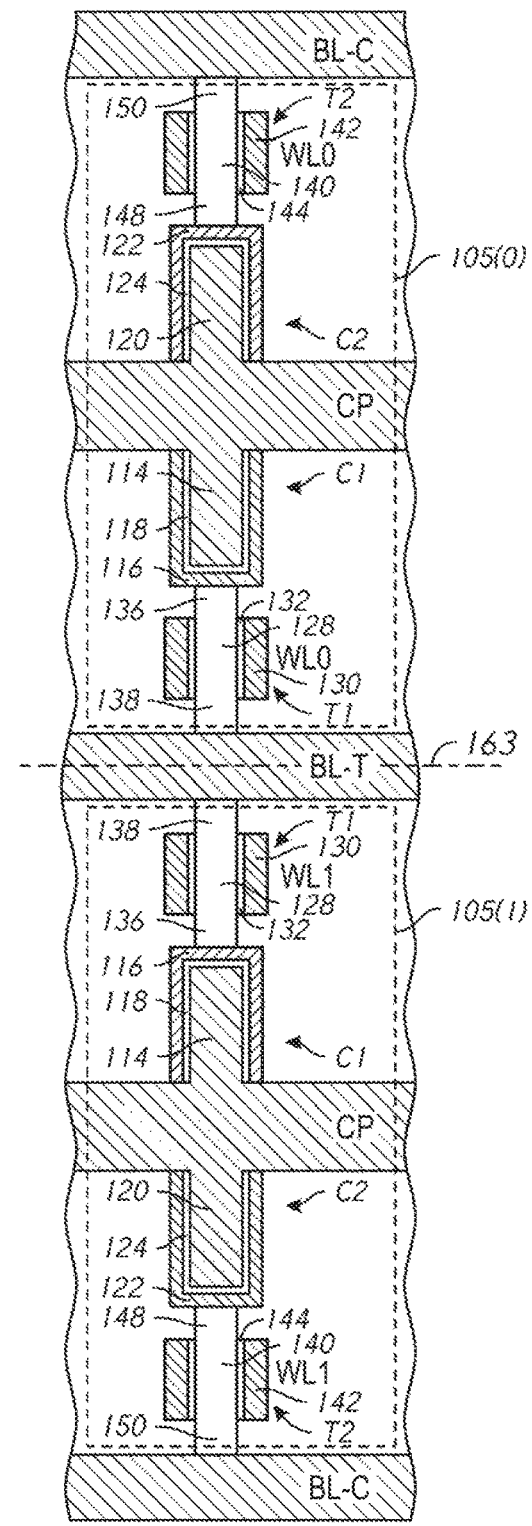
FIG. 7B is a diagrammatic cross-sectional side view of a region of an example memory array showing example memory cells including two transistors and two capacitors according to an embodiment of the disclosure.

FIG. 7B shows a region of a memory array 10 including example memory cells 105(0) and 105(1) of FIG. 7A according to an embodiment of the disclosure. In the embodiment of FIG. 7B, the memory cells 105(0) is vertically stacked over the memory cell 105(1). A dashed line demarcates an approximate boundary of the memory cells 105(0) and 105(1). In some embodiments the configuration of the memory cells 105 may be considered to comprise memory cells within a $4F^2$ architecture, where F indicates a minimum features size of a given technology.

The memory cells 105(0) and 105(1) are similar to the memory cells 105(0) and 105(1) of the embodiment of FIG. 4B, however, the memory cells 105(0) and 105(1) are vertically stacked in the embodiment of FIG. 7B rather than laterally displaced as in the embodiment of FIG. 4B. The memory cells 105(0) and 105(1) of the embodiment of FIG. 7B include the same elements as the memory cells 105(0) and 105(1) of the embodiment of FIG. 4B. Where applicable, the reference numbers of the memory cells 105(0) and 105(1) of the embodiment of FIG. 4B are used for the memory cells 105(0) and 105(1) of the embodiment of FIG. 7B. The memory cells 105(0) and 105(1) share a digit line BL-T.

The memory cell 105(0) includes first and second capacitors, C1 and C2, which are vertically displaced relative to one another, with the second capacitor C2 being above the first capacitor C1. A first transistor T1 is between the first capacitor C1 and the digit line BL-T, and the second transistor T2 is between the second capacitor C2 and the digit line BL-C. In the illustrated embodiments of FIG. 7B the first and second transistors T1 and T2 of the memory cell 105(0) are vertically displaced relative to one another, as are the first and second capacitors C1 and C2. Further, the first and second capacitors C1 and C2, and first and second transistors T1 and T2, are in a common vertical plane as one another (i.e., are vertically stacked one atop another). In other embodiments the first and second capacitors C1 and C2, and/or first and second transistors T1 and T2, may be provided in different configurations.

The memory cells 105(0) and 105(1) are substantially identical to one another, with the term "substantially identical" meaning that the memory cells are identical to within reasonable tolerances of fabrication and measurement. The memory cell 105(1) comprises first and second capacitors C1 and C2 together with first and second transistors T1 and T2. An axis 163 extending through the digit line BL-T may be considered to define a mirror plane. The memory cell 105(1) may be considered to be a substantially mirror image of the memory cell 105(0) across the mirror plane. The term "substantially mirror image" is utilized to indicate that the memory cell 105(1) may be a mirror image of the memory cell 105(0) to within reasonable tolerances of fabrication and measurement. In comparison to the memory cells 105(0) and 105(1) previously discussed with reference to FIG. 4B, the memory cells 105(0) and 105(1) of the illustrated embodiments of FIG. 7B are similar to in structure to the memory cells of FIG. 4B, but are vertically stacked and mirrored with respect to the digit line BL-T, whereas the memory cells 105(0) and 105(1) of FIG. 4B are laterally displaced.

Figure 8A:
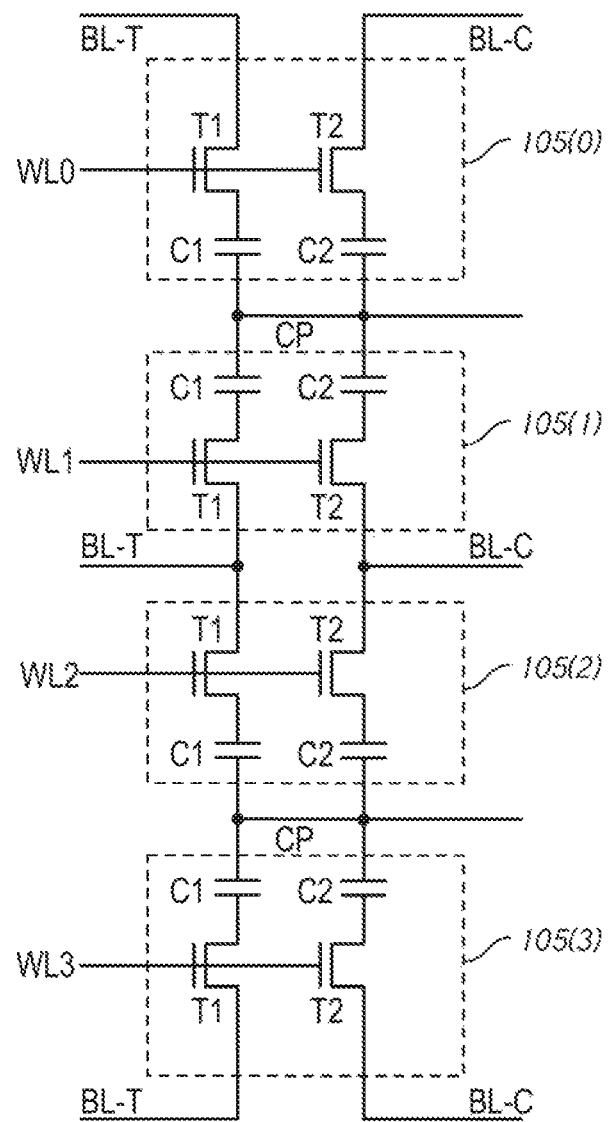
FIG. 8A is a schematic diagram of example memory cells including two transistors and two capacitors according to an embodiment of the disclosure.

FIG. 8A is a schematic diagram of four memory cells 105(0)-105(3) according to an embodiment of the disclosure. A dashed line demarcates an approximate boundary of the memory cell 105. Each of the memory cells 105 includes two selection components T1 and T2 and two capacitors C1 and C2. The capacitors C1 and C2 may be ferroelectric capacitors. The selection components T1 and T2 may be transistors, for example, n-type field effect transistors. In such an example, each of the memory cells 105 includes two transistors and two capacitors (e.g., 2T2C). The memory cells 105(0) and 105(1), similarly to cells of FIG. 6A, share a plate line structure CP and are coupled to different digit lines BL-T and different digit lines BL-C. The memory cells 105(2) and 105(3) also share a plate line structure CP and are coupled to different digit lines BL-T and different digit lines BL-C. The memory cells 105(1) and 105(2) share the digit lines BL-T and share the digit lines BL-C, similarly to cells 105(0) and 105(1) in FIG. 5A. As previously discussed, when coupled to the digit lines BL-T and BL-C, the memory cells 105 may be accessed. For example, a stored state of the memory cells 105 may be read and/or the memory cells 105 may be written to store a new state or the same state. Various voltages, for example, complementary voltages in some embodiments, may be applied to the plates of the capacitor C1 and C2 over the digit lines BL-T and BL-C and the plate line CP to access (e.g., read and/or write) the memory cells 105.

Figure 8B:
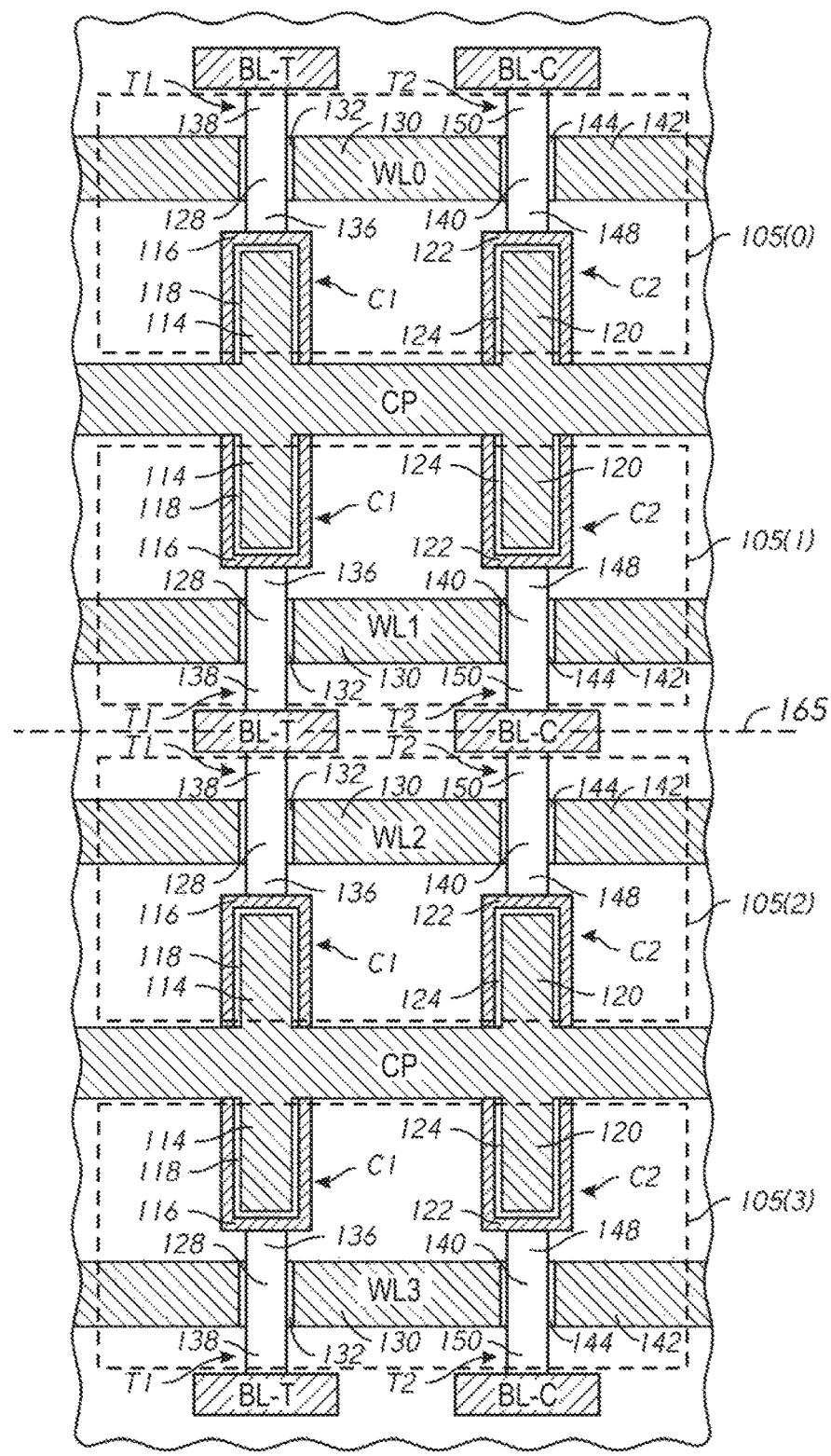
FIG. 8B is a diagrammatic cross-sectional side view of a region of an example memory array showing example memory cells including two transistors and two capacitors according to an embodiment of the disclosure.

FIG. 8B shows a portion of a memory array comprising example memory cells 105(0)-105(3) of FIG. 8A according to an embodiment of the disclosure. In the embodiment of FIG. 8B, the memory cells 105(0)-105(3) are vertically stacked. A dashed line demarcates an approximate boundary of the memory cells 105(0) and 105(1). In some embodiments the memory cells 105(0)-105(3) of FIG. 8B may be considered to comprise memory cells within an $8F^2$ architecture, where F indicates a minimum features size of a given technology.

The memory cells 105(0) and 105(1) have a similar configuration as the memory cells 105(0) and 105(1) of the embodiment of FIG. 6B. The memory cells 105(2) and 105(3) also have a similar configuration as the memory cells 105(0) and 105(1) of the embodiment of FIG. 6B. In comparison with the memory cells 105(0) and 105(1) of FIG. 6B, however, two vertically stacked memory cells 105 (e.g., memory cells 105(0) and 105(1) of FIG. 8B) are stacked on two other vertically stacked memory cells 105 (e.g., memory cells 105(2) and 105(3) of FIG. 8B). The memory cells 105(0) and 105(1), and the memory cells 105(2) and 105(3) of the embodiment of FIG. 8B include the same elements as the memory cells 105(0) and 105(1) of the embodiment of FIG. 4B. Where applicable, the reference numbers of the memory cells 105(0) and 105(1) of the embodiment of FIG. 4B are used for the memory cells 105(0) and 105(1), and memory cells 105(2) and 105(3) of the embodiment of FIG. 7B. The memory cells 105(1) and 105(2) share a digit line BL-T and share a digit line BL-C.

The memory cell 105(0) comprises first and second transistors T1 and T2 which are laterally displaced relative to one another. The memory cell 105(0) comprises a first capacitor C1 below the first transistor T1, and comprises a second capacitor C2 below the second transistor T2. The first and second capacitors C1 and C2 are laterally displaced relative to one another, with the second capacitor C2 being in a same horizontal plane as the first capacitor C1. The first transistor T1 is between the first capacitor C1 and a digit line BL-T, and the second transistor T2 is between the second capacitor C2 and a digit line BL-C. The digit lines BL-T and BL-C extend in and out of the page relative to the cross-section of FIG. 6B. In the shown embodiment the first and second transistors T1 and T2 are in a common horizontal plane as one another, and the word line WL0 extends along such horizontal plane and comprises the gates 130 and 142 of the first and second transistors T1 and T2.

The memory cell 105(1) is similar to memory cell 105(0), and comprises first and second capacitors C1 and C2 together with first and second transistors T1 and T2. The first and second transistors T1 and T2 comprise conductive gates 130 and 142 which are coupled with a second word line WL1. The first plates 114 and 120 of the first and second capacitors C1 and C2 are coupled with the plate line structure CP. The memory cell 105(2) and 105(3) are also similar to memory cell 105(0), and each comprise first and second capacitors C1 and C2 together with first and second transistors T1 and T2. The first and second transistors T1 and T2 of the memory cell 105(2) are coupled with third word line WL2 and the first and second transistors T1 and T2 of the memory cell 105(3) are coupled with a fourth word line WL3.

In the illustrated embodiment the digit line BL-T and BL-C are in a common horizontal plane as one another. An axis 165 extending through the digit lines BL-T and BL-C shared by the memory cells 105(1) and 105(2) may be considered to define a mirror plane. The memory cells 105(3) and 105(2) may be considered to be a substantially mirror image of the memory cell 105(0) and 105(1) across the mirror plane. The term "substantially mirror image" is utilized to indicate that the memory cells 105(3) and 105(2) may be a mirror image of the memory cell 105(0) and 105(1) to within reasonable tolerances of fabrication and measurement.

Figure 9A:
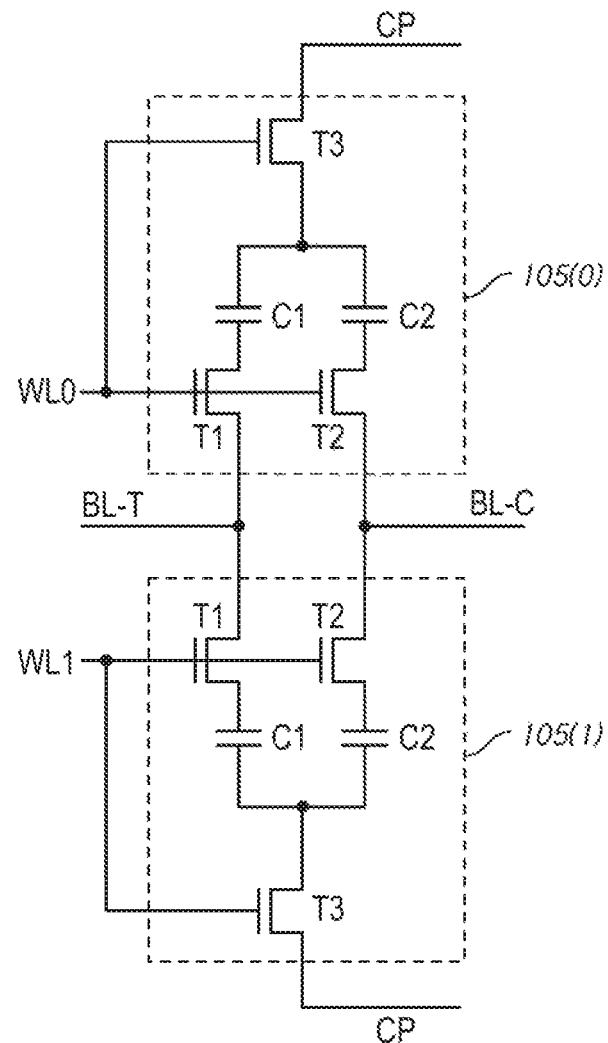
FIG. 9A is a schematic diagram of example memory cells including three transistors and two capacitors according to an embodiment of the disclosure.

FIG. 9A is a schematic diagram of two memory cells 105(0) and 105(1) according to an embodiment of the disclosure. A dashed line demarcates an approximate boundary of the memory cell 105. Each of the memory cells 105 includes three selection components T1, T2, and T3 and two capacitors C1 and C2. The capacitors C1 and C2 may be ferroelectric capacitors. The selection components T1, T2, and T3 may be transistors, for example, n-type field effect transistors. In such an example, each of the memory cells 105 includes three transistors and two capacitors (e.g., 3T2C).

Operation of the selection components T1, T2, and T3 is controlled by applying voltages to the transistor gates. A respective word line WL may activate the selection components (e.g., WL0 may activate the selection components T1, T2, and T3 of memory cell 105(0) and WL1 may activate the selection components T1, T2, and T3 of memory cell 105(1)). The capacitor C1 has a first plate coupled to the selection component T3 and has a second plate. The capacitor C2 has a first plate coupled to the selection component T3 and a second plate. The selection component T3 is further coupled to the plate line CP. The second plate of the capacitor C1 is coupled to the selection component T1 and the second plate of the capacitor C2 is coupled to the selection component T2. The selection component T1 is further coupled to a digit line BL-T and the selection component T2 is further coupled to a digit line BL-C. When the selection components T1, T2, and T3 are activated, such as by respective word line WL, the second plate of the capacitor C1 and the second plate of the capacitor C2 are coupled to the digit lines BL-T and BL-C, respectively, and the first plate of the capacitor C1 and the first plate of the capacitor C2 are coupled to the plate line CP. As previously discussed, when coupled to the digit lines BL-T and BL-C, the memory cells 105 may be accessed. For example, a stored state of the memory cells 105 may be read and/or the memory cells 105 may be written to store a new state or the same state. Various voltages, for example, complementary voltages in some embodiments, may be applied to the plates of the capacitor C1 and C2 over the digit lines BL-T and BL-C and the plate line CP to access (e.g., read and/or write) the memory cells 105.

Figure 9B:
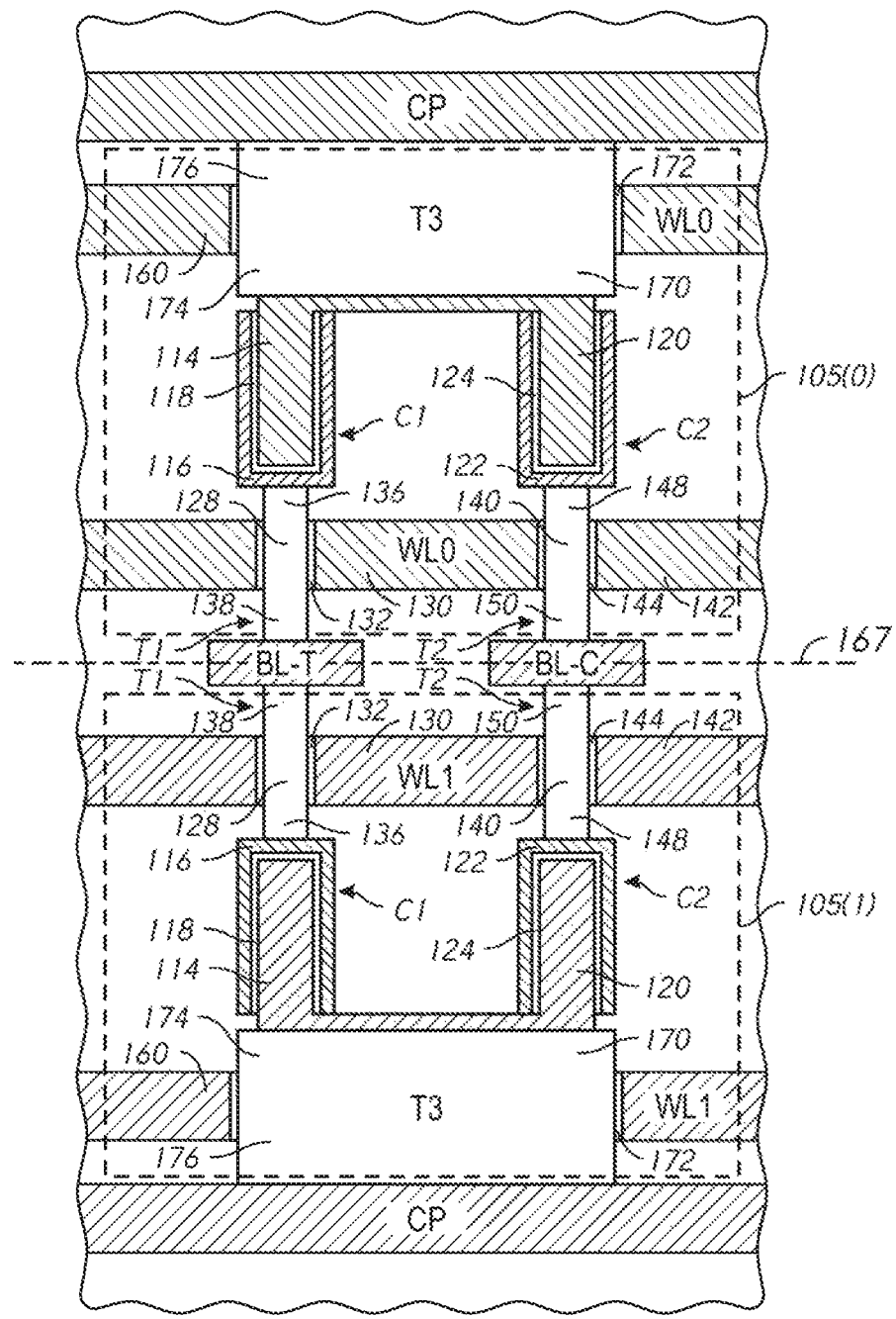
FIG. 9B is a diagrammatic cross-sectional side view of a region of an example memory array showing example memory cells including three transistors and two capacitors according to an embodiment of the disclosure.

FIG. 9B shows a portion of a memory array 10 including example memory cells 105(0) and 105(1) of FIG. 9A according to an embodiment of the disclosure. In the embodiment of FIG. 9B, the memory cell 105(0) is vertically stacked over the memory cell 105(1). A dashed line demarcates an approximate boundary of the memory cells 105(0) and 105(1). In some embodiments the memory cells 105 of FIG. 9B may be considered to comprise memory cells within an $8F^2$ architecture, where F indicates a minimum features size of a given technology.

The illustrated portion of memory array 10 may be supported by a base (not shown) analogous to the base of FIG. 4B. The memory cells 105(0) and 105(1) are in a common column as one another within the memory array. Digit lines BL-T and BL-C are between the memory cells 105(0) and 105(1), and extend in and out of the page relative to the cross-section of FIG. 9B. The digit lines BL-T and BL-C may be coupled with a sense component 25 of the type previously described with reference to FIGS. 1 and 2. The digit lines BL-T and BL-C are shared by the memory cells 105(0) and 105(1).

The memory cell 105(0) comprises first and second transistors T1 and T2 which are laterally displaced relative to one another. The memory cell 105(0) comprises the first capacitor C1 above the first transistor T, and comprises the second capacitor C2 above the second transistor T2. The first capacitor C1 comprises a first plate 114, a second plate 116, and ferroelectric material 118 between the first and second plates 114 and 116. The second capacitor C2 comprises a first plate 120 and a second plate 122, and ferroelectric material 124 between the first and second plates 120 and 122.

In the shown embodiment the second plates 116 and 122 are container-shaped outer plates, and the first plates 114 and 120 are inner plates which extend into the container-shaped outer plates. In other embodiments the second plates 116 and 122 may have other configurations, and the first plates 114 and 120 may also have other configurations.

The first plates 114 and 120 are coupled with a third transistor T3 which is vertically displaced relative to the transistors T1 and T2. The third transistor T3 may be vertically displaced relative to the capacitors C1 and C2. The transistor T3 is coupled to a plate line structure CP provided above the transistor T3 and above first and second capacitors C1 and C2. In the illustrated embodiment the first plates 114 and 120 share a common composition.

The first and second capacitors C1 and C2 are laterally displaced relative to one another, and in the shown embodiment are in a same horizontal plane as one another (i.e., are horizontally aligned with one another). The first transistor T1 is between the first capacitor C1 and the digit line BL-T, and the second transistor T2 is between the second capacitor C2 and the digit line BL-C. In the shown embodiment the first and second transistors T1 and T2 are in a common horizontal plane as one another, and the word line WL0 extends along such horizontal plane and comprises the gates 130 and 142 of the first and second transistors T1 and T2. The third transistor T3 is between the first and second capacitors C1 and C2 and the plate line structure CP. A word line WL0 extends along a horizontal plane and comprises a gate 160 of the third transistor T3. The WL0 of the third transistor T3 extends along a horizontal plane that is vertically displaced from the common horizontal plane of the first and second transistors T1 and T2, and of the word line WL0 of the first and second transistors T1 and T2.

A first semiconductor pillar 128 extends upwardly from the digit line BL-T to the second plate 116 of the first capacitor C1, and the first transistor T1 is along such first semiconductor pillar. A second semiconductor pillar 140 extends upwardly from the digit line BL-C to the second plate 122 of the second capacitor C2, and the second transistor T2 is along the second semiconductor pillar 140.

The first transistor T1 includes the gate dielectric material 132, and further includes the first channel region within the semiconductor pillar 128 and along the gate dielectric material 132, and source/drain regions 136 and 138 within the semiconductor pillar and on opposing sides of the channel region. The source/drain region 136 is coupled with the second plate 116 of first capacitor C1, and the source/drain region 138 is coupled with the digit line BL-T. The second transistor T2 includes the gate dielectric material 144, and further includes the second channel region, and source/drain regions 148 and 150 within the semiconductor pillar and on opposing sides of the channel region. The source/drain region 148 is coupled with the second plate 122 of second capacitor C2, and the source/drain region 150 is coupled with the digit line BL-C.

A third semiconductor pillar 170 extends upwardly from the first plates 114 and 120 to the plate line structure CP. The third transistor T3 is along the third semiconductor pillar 170. The third transistor T3 includes a gate dielectric material 172, a third channel region, and source/drain regions 174 and 176. The source/drain region 174 is coupled with the first plates 114 and 120 of the first and second capacitors C1 and C2, and the source/drain region 176 is coupled with the plate line structure CP. In some embodiments, the third semiconductor pillar 170 may have different dimensions (e.g., channel length and/or width) from the first and second semiconductor pillars 128 and 140, as is shown in FIG. 9B. In other embodiments, the third pillar 170 may have similar dimensions (e.g., channel length and/or width) as the first and second semiconductor pillars 128 and 140.

The memory cell 105(1) similar to memory cell 105(0), and comprises first and second capacitors C1 and C2 together with transistors T1, T2, and T3. The transistors T1 and T2 comprise conductive gates 130 and 142 which are coupled with a second word line WL1, and the transistor T3 comprises conductive gate 160 which is coupled with the second word line WL1 that extends along a horizontal plane that is vertically displaced from the common horizontal plane of the first and second transistors T1 and T2.

The memory cell 105(1) comprises first and second transistors T1 and T2 which are laterally displaced relative to one another. The memory cell 105(1) comprises the first capacitor C1 below the first transistor T1, and comprises the second capacitor C2 below the second transistor T2. The first capacitor C1 comprises a first plate 114, a second plate 116, and ferroelectric material 118 between the first and second plates 114 and 116. The second capacitor C2 comprises a first plate 120, a second plate 122, and ferroelectric material 124 between the first and second plates 120 and 122. A third transistor T3 is vertically displaced from the first and second transistors T1 and T2 and between the capacitors C1 and C2 and the plate line structure CP.

In the illustrated embodiment the digit line BL-T and BL-C are in a common horizontal plane as one another. An axis 167 extending through the digit lines BL-T and BL-C may be considered to define a mirror plane. The memory cell 105(1) may be considered to be a substantially mirror image of the memory cell 105(0) across the mirror plane. The term "substantially mirror image" is utilized to indicate that the memory cell 105(1) may be a mirror image of the memory cell 105(0) to within reasonable tolerances of fabrication and measurement.

Figure 10A:
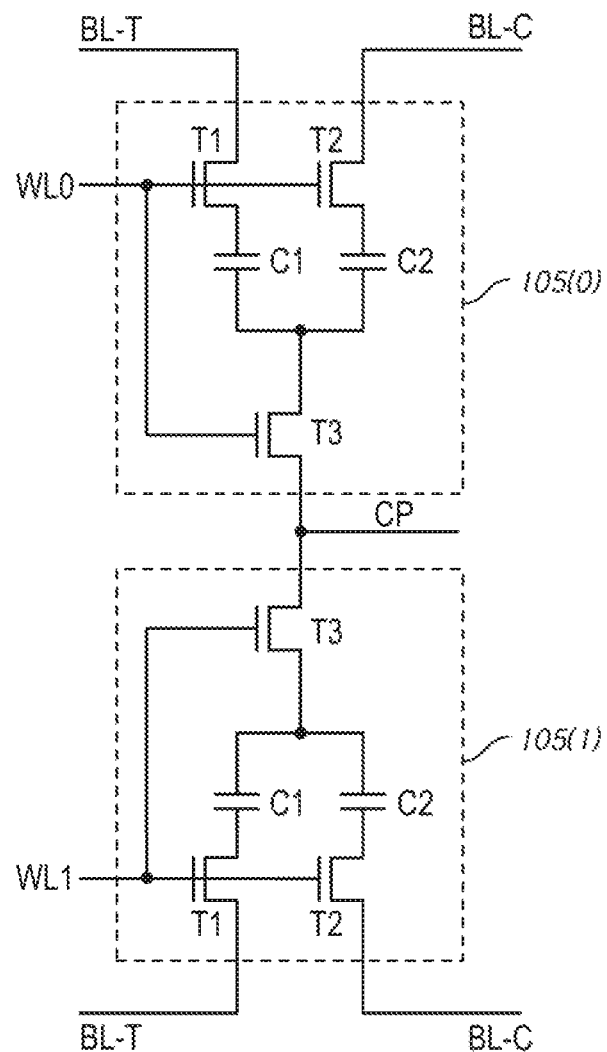
FIG. 10A is a schematic diagram of example memory cells including three transistors and two capacitors according to an embodiment of the disclosure.
Figure 10B:
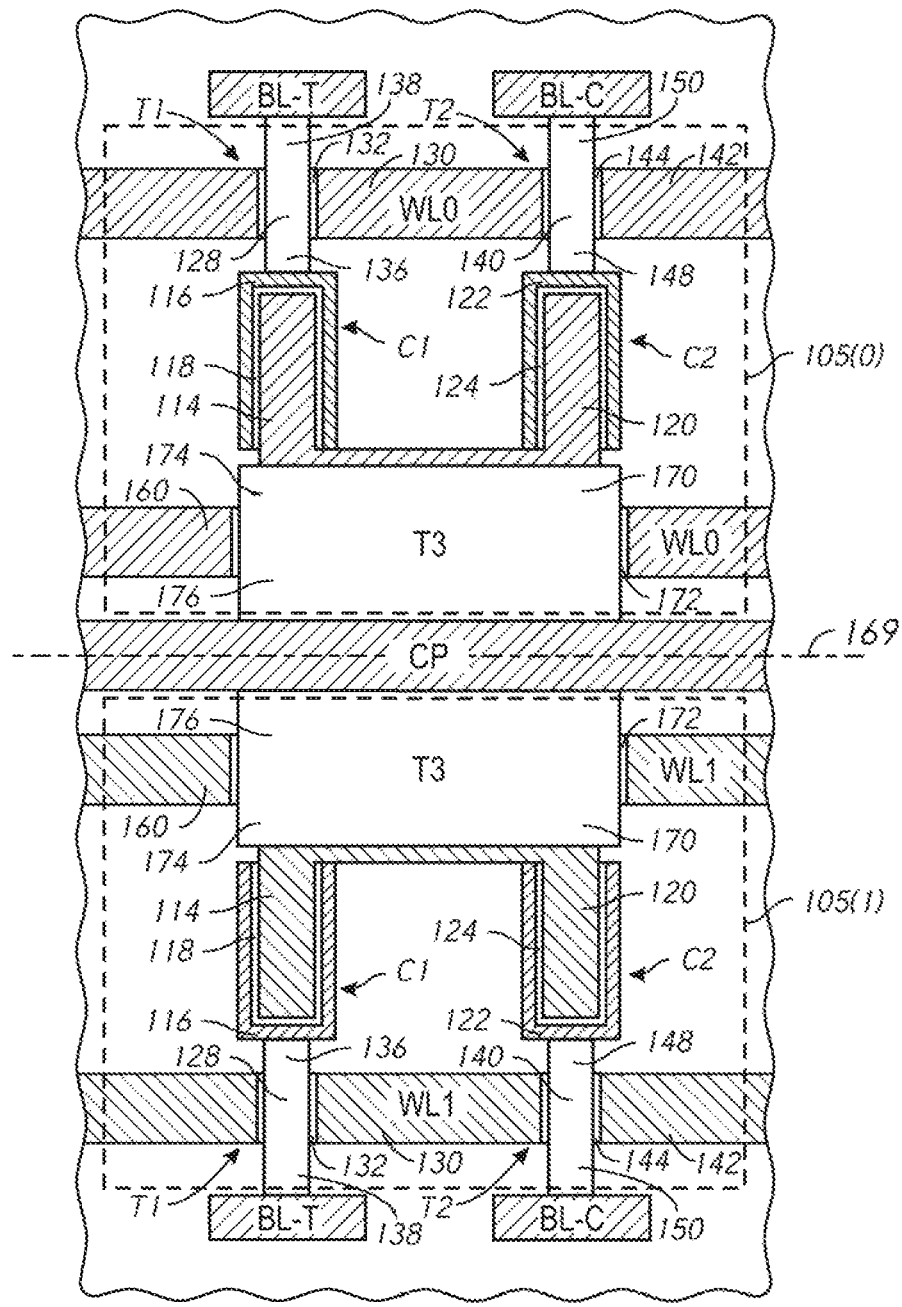
FIG. 10B is a diagrammatic cross-sectional side view of a region of an example memory array showing example memory cells including three transistors and two capacitors according to an embodiment of the disclosure.

In the illustrated embodiment of FIG. 9B the digit lines BL-T and BL-C are shared by the memory cells 105(0) and 105(1). In other embodiments a plate line structure CP may be shared by memory cells 105(0) and 105(1), which are vertically displaced on opposing sides of the plate line structure CP from one another. FIGS. 10A and 10B illustrate an example of such other embodiments.

FIG. 10A is a schematic diagram of two memory cells 105(0) and 105(1) according to an embodiment of the disclosure. A dashed line demarcates an approximate boundary of the memory cell 105. Each of the memory cells 105 includes three selection components T1, T2, and T3 and two capacitors C1 and C2. The capacitors C1 and C2 may be ferroelectric capacitors. The selection components T1, T2, and T3 may be transistors, for example, n-type field effect transistors. In such an example, each of the memory cells 105 includes three transistors and two capacitors (e.g., 3T2C).

The memory cells 105(0) and 105(1) of FIG. 10A share a plate line structure CP and are coupled to different digit lines BL-T and different digit lines BL-C. In contrast, the memory cells 105(0) and 105(1) of FIG. 9A share digit lines BL-T and share digit lines BL-C and are coupled to different plate lines CP.

Operation of the memory cells 105(0) and 105(1) of FIG. 10A is similar to the operation of the memory cells 105(0) and 105(1) of FIG. 9A, and will not be repeated in the interest of brevity.

The capacitor C1 has a first plate coupled to the selection component T3 and has a second plate. The capacitor C2 has a first plate coupled to the selection component T3 and a second plate. The selection component T3 is further coupled to the plate line CP. The second plate of the capacitor C1 is coupled to the selection component T1 and the second plate of the capacitor C2 is coupled to the selection component T2. The selection component T is further coupled to a digit line BL-T and the selection component T2 is further coupled to a digit line BL-C. When the selection components T1, T2, and T3 are activated, such as by respective word line WL, the second plate of the capacitor C1 and the second plate of the capacitor C2 are coupled to the digit lines BL-T and BL-C, respectively, and the first plate of the capacitor C1 and the first plate of the capacitor C2 are coupled to the plate line CP.

FIG. 10B shows a portion of a memory array 10 comprising a pair of memory cells 105(0) and 105(1) of FIG. 10A according to an embodiment of the disclosure. In the embodiment of FIG. 10B, the memory cell 105(0) is vertically stacked over the memory cell 105(1). A dashed line demarcates an approximate boundary of the memory cells 105(0) and 105(1). In some embodiments the memory cells 105 of FIG. 9B may be considered to comprise memory cells within an $8F^2$ architecture, where F indicates a minimum features size of a given technology.

The illustrated portion of memory array 10 may be supported by a base (not shown) analogous to the base of FIG. 4B. The memory cells 105(0) and 105(1) are in a common column as one another within the memory array. A horizontally-extending rail is between the memory cells 105(0) and 105(1), and extends along the cross-section of FIG. 10B. The rail is a plate line structure CP that is shared by the memory cells 105(0) and 105(1). The memory cell 105(0) comprises first and second transistors T1 and T2 which are laterally displaced relative to one another. The memory cell 105(0) comprises a first capacitor C1 below the first transistor T1, and comprises a second capacitor C2 below the second transistor T2. In contrast to the memory cells of FIG. 9B, the memory cells 105(0) and 105(1) of FIG. 10B share a plate line structure CP and are coupled to different digit lines BL-T and different digit lines BL-C.

The first capacitor C1 comprises a first plate 114, a second plate 116, and ferroelectric material 118 between the first and second plates 114 and 116. The second capacitor C2 comprises a first plate 120 and a second plate 122, and ferroelectric material 124 between the first and second plates 120 and 122.

In the shown embodiment the second plates 116 and 122 are container-shaped outer plates, and the first plates 114 and 120 are inner plates which extend into the container-shaped outer plates. In other embodiments the second plates 116 and 122 may have other configurations, and the first plates 114 and 120 may also have other configurations.

The first plates 114 and 120 are coupled with the third transistor T3, which is vertically displaced relative to the transistors T1 and T2, and capacitors C1 and C2. The third transistor T3 is coupled to a plate line structure CP. In the illustrated embodiment the first plates 114 and 120 share a common composition.

The first and second capacitors C1 and C2 are laterally displaced relative to one another, with the second capacitor C2 being in a same horizontal plane as the first capacitor C1. The first transistor T1 is between the first capacitor C1 and a digit line BL-T, and the second transistor T2 is between the second capacitor C2 and a digit line BL-C. The digit lines BL-T and BL-C extend in and out of the page relative to the cross-section of FIG. 10B. In the shown embodiment the first and second transistors T1 and T2 are in a common horizontal plane as one another, and the word line WL0 extends along such horizontal plane and comprises the gates 130 and 142 of the first and second transistors T1 and T2. The third transistor T3 is between the first and second capacitors C1 and C2 and the plate line structure CP. A word line WL0 extends along a horizontal plane and comprises gate 160 of the third transistor T3. The WL0 of the third transistor T3 extends along a horizontal plane that is vertically displaced from the common horizontal plane of the first and second transistors T1 and T2, and of the word line WL0 of the first and second transistors T1 and T2.

A first semiconductor pillar 128 extends downwardly from the digit line BL-T to the second plate 116 of the first capacitor C1, and the first transistor T1 is along such first semiconductor pillar. A second semiconductor pillar 140 extends downwardly from the digit line BL-C to the second plate 122 of the second capacitor C2, and the second transistor T2 is along such second semiconductor pillar 140.

The first transistor T1 includes the gate dielectric material 132, and further includes the first channel region within the semiconductor pillar 128 and along the gate dielectric material 132, and the source/drain regions 136 and 138. The source/drain region 136 is coupled with the second plate 116 of first capacitor C1, and the source/drain region 138 is coupled with the digit line BL-T. The second transistor T2 includes the gate dielectric material 144, and further includes the second channel region, and the source/drain regions 148 and 150 within the semiconductor pillar and on opposing sides of the channel region. The source/drain region 148 is coupled with the second plate 122 of second capacitor C2, and the source/drain region 150 is coupled with the digit line BL-C.

A third semiconductor pillar 170 extends downwardly from the first plates 114 and 120 of the first and second capacitors C1 and C2 to the plate line structure CP. The third transistor T3 is along the third semiconductor pillar 170. The third transistor T3 includes a gate dielectric material 172, a third channel region, and source/drain regions 174 and 176. The source/drain region 174 is coupled with the first plates 114 and 120 of the first and second capacitors C1 and C2, and the source/drain region 176 is coupled with the plate line structure CP. In some embodiments, the third semiconductor pillar 170 may have different dimensions (e.g., channel length and/or width) from the first and second semiconductor pillars 128 and 140, as is shown in FIG. 10B. In other embodiments, the third pillar 170 may have similar or the same dimensions (e.g., channel length and/or width) as the first and second semiconductor pillars 128 and 140.

The memory cell 105(1) is similar to memory cell 105(0), and comprises first and second capacitors C1 and C2 together with transistors T1, T2, and T3. The first and second transistors T1 and T2 comprise conductive gates 130 and 142 which are coupled with a second word line WL1, and the transistor T3 comprises conductive gate 160 which is coupled with the second word line WL1 that extends along a horizontal plane that is vertically displaced from the common horizontal plane of the first and second transistors T1 and T2.

The memory cell 105(1) comprises first and second transistors T1 and T2 which are laterally displaced relative to one another. The memory cell 105(1) comprises the first capacitor C1 above the first transistor T1, and comprises the second capacitor C2 above the second transistor T2. The first capacitor C1 comprises a first plate 114, a second plate 116, and ferroelectric material 118 between the first and second plates 114 and 116. The second capacitor C2 comprises a first plate 120, a second plate 122, and ferroelectric material 124 between the first and second plates 120 and 122. A third transistor T3 is vertically displaced from the first and second transistors T1 and T2 and between the capacitors C1 and C2 and the plate line structure CP.

An axis 169 extending along the plate line structure CP may be considered to define a mirror plane. The memory cell 105(1) may be considered to be a substantially mirror image of the memory cell 105(0) across the mirror plane. The term "substantially mirror image" is utilized to indicate that the memory cell 105(1) may be a mirror image of the memory cell 105(0) to within reasonable tolerances of fabrication and measurement. In comparison to the memory cells 105(0) and 105(1) previously discussed with reference to FIG. 9B, the memory cells 105(0) and 105(1) of the illustrated embodiments of FIG. 10B are mirrored with respect to the plate line structure CP whereas the memory cells 105(0) and 105(1) of FIG. 9B are mirrored with respect to the digit lines BL-T and BL-C.

In the illustrated embodiment the digit line BL-T of memory cell 105(0) (i.e., the digit line BL-T above word line WL0) and the digit line BL-T of memory cell 105(1) (i.e., the digit line BL-T below word line WL1) are coupled to one another. The digit line BL-C of memory cell 105(0) (i.e., the digit line BL-C above word line WL0) and the digit line BL-C of memory cell 105(1) (i.e., the digit line BL-C below word line WL1) are coupled to one another. Electrical properties of the coupled digit lines BL-T are compared with those of the coupled digit lines BL-C with a sense component 25 of the type described above with reference to FIGS. 1 and 2.

Figure 11A:
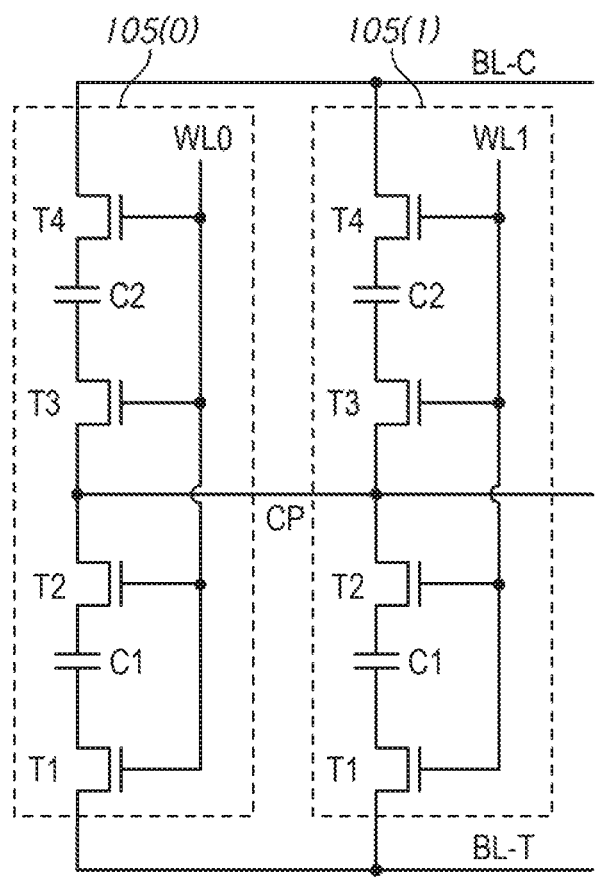
FIG. 11A is a schematic diagram of example memory cells including four transistors and two capacitors according to an embodiment of the disclosure.

FIG. 11A is a schematic diagram of two memory cells 105(0) and 105(1) according to an embodiment of the disclosure. A dashed line demarcates an approximate boundary of the memory cell 105. Each of the memory cells 105 includes four selection components T1-T4 and two capacitors C1 and C2. The capacitors C1 and C2 may be ferroelectric capacitors. The selection components T1-T4 may be transistors, for example, n-type field effect transistors. In such an example, each of the memory cells 105 includes four transistors and two capacitors (e.g., 4T2C).

Operation of the selection components T1-T4 is controlled by applying voltages to the transistor gates. A respective word line WL may activate the selection components (e.g., WL0 may activate the selection components T1-T4 of memory cell 105(0) and WL1 may activate the selection components T1-T4 of memory cell 105(1)).

The capacitors C1 and C2 each have a first plate coupled to a respective selection component T2 and T3 and have a second plate coupled to a respective selection component T1 and T4. The second plate of the capacitor C1 is coupled to the selection component T1 and the second plate of the capacitor C2 is coupled to the selection component T4. The selection component T1 is further coupled to a digit line BL-T and the selection component T4 is further coupled to a digit line BL-C. When activated, such as by respective word line WL, the second plates of the capacitors C1 and C2 are coupled to the digit lines BL-T and BL-C, respectively. The selection components T2 and T3 are further coupled to a plate line CP. When activated, such as by respective word line WL, the first plates of the capacitors C1 and C2 are coupled to the plate line CP. As previously discussed, when coupled to the digit lines BL-T and BL-C, the memory cells 105 may be accessed. For example, a stored state of the memory cells 105 may be read and/or the memory cells 105 may be written to store a new state or the same state. Various voltages, for example, complementary voltages in some embodiments, may be applied to the plates of the capacitor C1 and C2 over the digit lines BL-T and BL-C and the plate line CP to access (e.g., read and/or write) the memory cells 105.

Figure 11B:
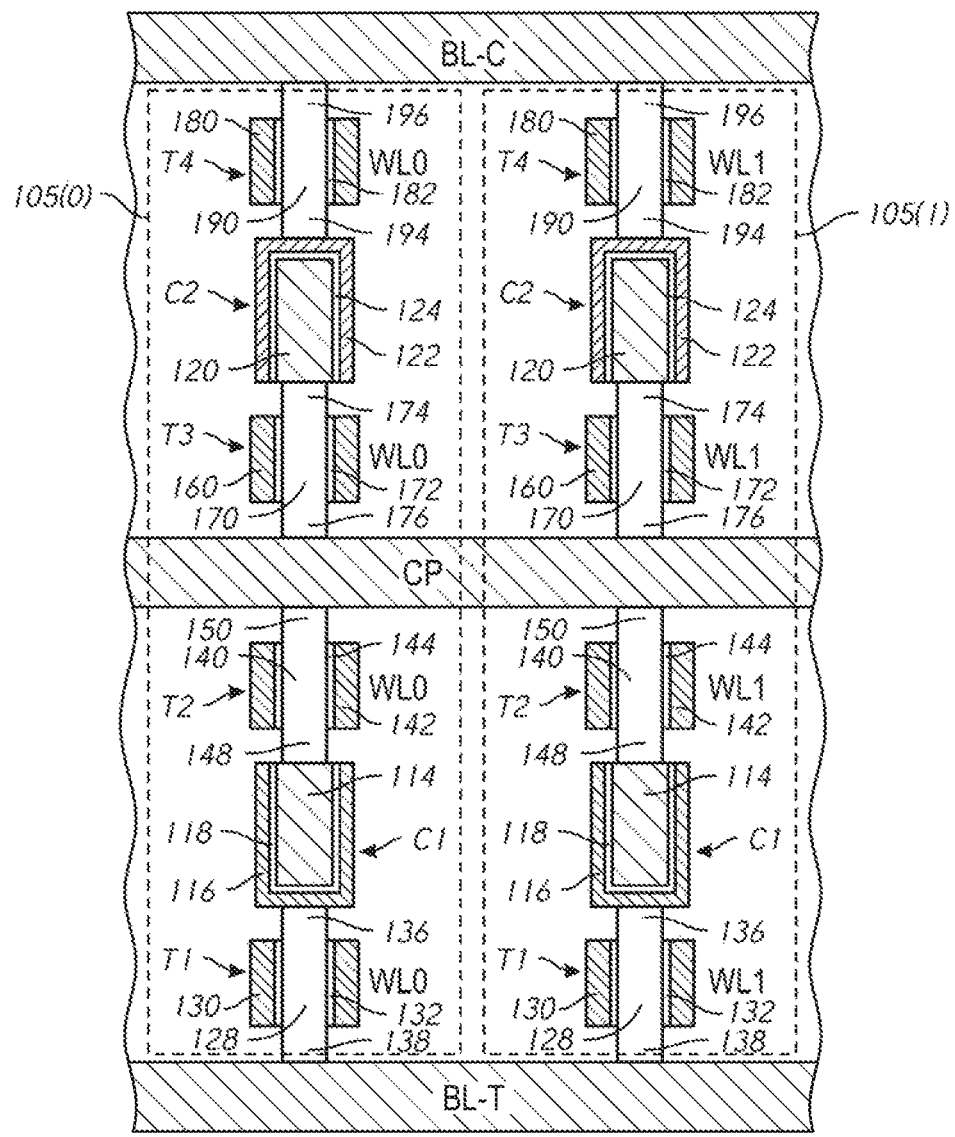
FIG. 11B is a diagrammatic cross-sectional side view of a region of an example memory array showing example memory cells including four transistors and two capacitors according to an embodiment of the disclosure.

FIG. 11B shows a region of a memory array 10 including example memory cells 105(0) and 105(1) of FIG. 11A according to an embodiment of the disclosure. In the embodiment of FIG. 11B, the memory cells 105(0) and 105(1) are laterally displaced relative to one another. A dashed line demarcates an approximate boundary of a memory cell 105. The memory cells 105(0) and 105(1) are substantially identical to one another, with the term "substantially identical" meaning that the memory cells are identical to within reasonable tolerances of fabrication and measurement. In some embodiments the configuration of the memory cells 105 may be considered to comprise memory cells within a 4F$^2$ architecture, where F indicates a minimum features size of a given technology.

The illustrated portion of memory array 10 may be supported by a base (not shown) analogous to the base of FIG. 4B. The adjacent memory cells 105(0) and 105(1) are in a common column as one another within the memory array. The memory cells 105(0) and 105(1) are shown along digit lines BL-T and BL-C. The digit lines BL-T and BL-C are coupled with a sense component 25 of the type described above with reference to FIGS. 1 and 2.

The memory cell 105 comprises first, second, third, and fourth transistors T1-T4 and first and second capacitors C1 and C2. In the illustrated embodiments of FIG. 11B the first, second, third, and fourth transistors T1-T4 of the memory cell 105(0) are vertically displaced relative to one another, as are the first and second capacitors C1 and C2. Further, the first and second capacitors C1 and C2, and first, second, third, and fourth transistors T1-T4 are in a common vertical plane as one another (i.e., are vertically stacked one atop another). The first capacitor C1 comprises a first plate 114, a second plate 116, and a ferroelectric material 118 between the first and second plates 114 and 116. Similarly, the second capacitor C2 comprises a first plate 120, a second plate 122, and a ferroelectric material 124 between the first and second plates 120 and 122.

The first transistor T1 is between the first capacitor C1 and the digit line BL-T, and the fourth transistor T4 is between the second capacitor C2 and the digit line BL-C. The second transistor T2 is between the first capacitor C1 and the plate line structure CP and the third transistor T3 is between the second capacitor C2 and the plate line structure CP.

In the shown embodiment a first semiconductor pillar 128 extends upwardly from the digit line BL-T to the second plate 116 of the first capacitor C1, and the first transistor T1 is along such first semiconductor pillar. The first transistor T1 has a conductive transistor gate 130 which is spaced from the semiconductor pillar 128 by gate dielectric material 132. The first transistor T1 has a channel region within semiconductor pillar 128 and along the gate dielectric material 132, and has source/drain regions 136 and 138 within the semiconductor pillar and on opposing sides of the channel region. The source/drain region 136 is coupled with the second plate 116 of the first capacitor C1, and the source/drain region 138 is coupled with the digit line BL-T. In the shown embodiment the source/drain region 136 extends to the second plate 116 of the first capacitor C1. A second semiconductor pillar 140 extends downwardly from the plate line structure CP to the first plate 114 of the first capacitor C1, and the second transistor T2 is along such second pillar. A third semiconductor pillar 170 extends upwardly from the plate line structure CP to the first plate 120 of the second capacitor C2, and the third transistor T3 is along the second semiconductor pillar 170. A fourth semiconductor pillar 190 extends downwardly from the digit line BL-C to the second plate 122 of the second capacitor C2, and the fourth transistor T4 is along the fourth semiconductor pillar 190.

The first transistor T1 includes the gate dielectric material 132, the channel region, and source/drain regions 136 and 138. The source/drain region 136 is coupled with the second plate 116 of first capacitor C1, and the source/drain region 138 is coupled with the digit line BL-T. The fourth transistor T4 includes the gate dielectric material 182, the channel region, and source/drain regions 194 and 196. The source/drain region 194 is coupled with the second plate 122 of second capacitor C2, and the source/drain region 196 is coupled with the digit line BL-C.

The second transistor T2 includes the gate dielectric material 144, the channel region, and source/drain regions 148 and 150. The source/drain region 148 is coupled with the first plate 114 of first capacitor C1, and the source/drain region 150 is coupled with the plate line structure CP. The third transistor T3 includes the gate dielectric material 172, the channel region, and source/drain regions 174 and 176. The source/drain region 174 is coupled with the first plate 120 of second capacitor C2, and the source/drain region 176 is coupled with the plate line structure CP. The conductive gates of the first, second, third, and fourth transistors T1-T4 are coupled with a first word line WL0. Such first word line may extend in and out of the page relative to the cross-section of FIG. 11B.

The memory cell 105(1) similar to memory cell 105(0), and comprises first and second capacitors C1 and C2 together with first, second, third, and fourth transistors T1, T2, T3, and T4. The first, second, third, and fourth transistors T1-T4 comprise conductive gates that are coupled with a second word line WL1. The first plates 114 and 120 of the first and second capacitors C1 and C2 are coupled with the second and third transistors T2 and T3 and the second plates 116 and 122 of the first and second capacitors C1 and C2 are coupled with the first and fourth transistors T1 and T4.

In the illustrated embodiment of FIG. 11B the plate line structure CP is a rail extending horizontally along the column defined by the digit lines BL-T and BL-C. Such plate line structure CP is shared by the memory cells 105(0) and 105(1), as well as by all other memory cells along such column.

Figure 12A:
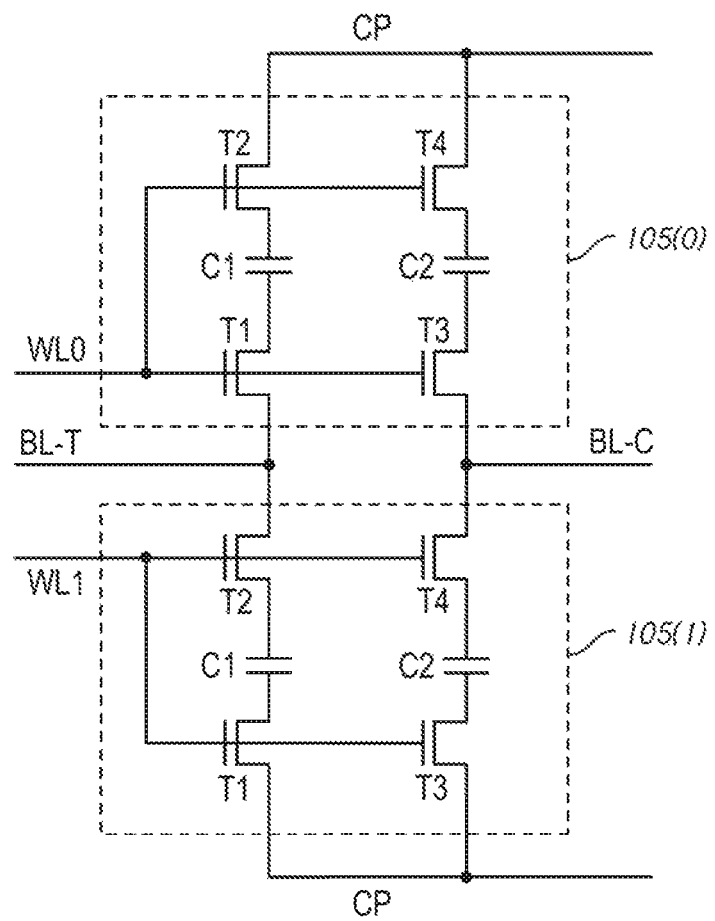
FIG. 12A is a schematic diagram of example memory cells including four transistors and two capacitors according to an embodiment of the disclosure.

FIG. 12A is a schematic diagram of two memory cells 105(0) and 105(1) according to an embodiment of the disclosure. A dashed line demarcates an approximate boundary of the memory cell 105. Each of the memory cells 105 includes four selection components T1-T4 and two capacitors C1 and C2. The capacitors C1 and C2 may be ferroelectric capacitors. The selection components T1-T4 may be transistors, for example, n-type field effect transistors. In such an example, each of the memory cells 105 includes four transistors and two capacitors (e.g., 4T2C).

Operation of the selection components T1-T4 is controlled by applying voltages to the transistor gates. A respective word line WL may activate the selection components (e.g., WL0 may activate the selection components T1-T4 of memory cell 105(0) and WL1 may activate the selection components T1-T4 of memory cell 105(1)). The capacitors C1 and C2 each have a first plate coupled to a plate line CP through transistors T2 and T4. The capacitor C1 has a second plate coupled to a digit line BL-T through transistor T1 and the capacitor C2 has a second plate coupled to a digit line BL-C through transistor T3. When the transistors T1 and T3 are activated, such as by respective word line WL, the second plates of the capacitors C1 and C2 are coupled to the digit lines BL-T and BL-C, respectively. As previously discussed, when coupled to the digit lines BL-T and BL-C, the memory cells 105 may be accessed. For example, a stored state of the memory cells 105 may be read and/or the memory cells 105 may be written to store a new state or the same state. Various voltages, for example, complementary voltages in some embodiments, may be applied to the plates of the capacitor C1 and C2 over the digit lines BL-T and BL-C and the plate line CP to access (e.g., read and/or write) the memory cells 105.

Figure 12B:
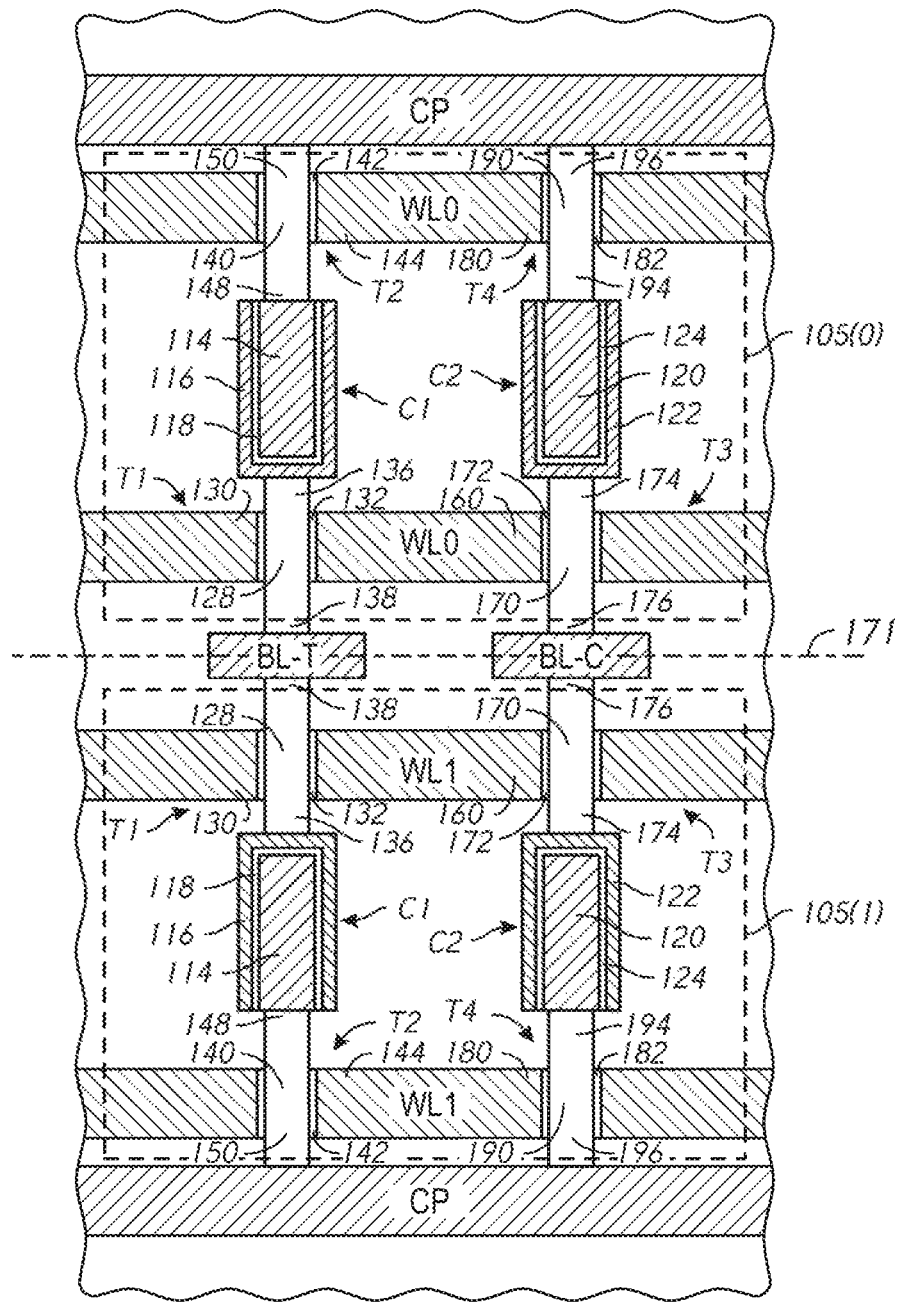
FIG. 12B is a diagrammatic cross-sectional side view of a region of an example memory array showing example memory cells including four transistors and two capacitors according to an embodiment of the disclosure.

FIG. 12B shows a portion of a memory array 10 including example memory cells 105(0) and 105(1) of FIG. 12A according to an embodiment of the disclosure. In the embodiment of FIG. 12B, the memory cell 105(0) is vertically stacked over the memory cell 105(1). A dashed line demarcates an approximate boundary of the memory cells 105(0) and 105(1). In some embodiments the memory cells 105 of FIG. 12B may be considered to comprise memory cells within an $8F^2$ architecture, where F indicates a minimum features size of a given technology.

The illustrated portion of memory array 10 may be supported by a base (not shown) analogous to the base of FIG. 4B. The memory cells 105(0) and 105(1) are in a common column as one another within the memory array. Digit lines BL-T and BL-C are between the memory cells 105(0) and 105(1), and extend in and out of the page relative to the cross-section of FIG. 12B. The digit lines BL-T and BL-C may be coupled with a sense component 25 of the type previously described with reference to FIGS. 1 and 2. The digit lines BL-T and BL-C are shared by the memory cells 105(0) and 105(1).

The memory cell 105(0) comprises first, second, third, and fourth transistors T1-T4. The first and third transistors T1 and T3 are laterally displaced relative to one another, and the second and fourth transistors T2 and T4 are laterally displaced relative to one another. The memory cell 105(0) comprises the first capacitor C1 between the first and second transistors T1 and T2, and comprises the second capacitor C2 between the third and fourth transistors T3 and T4. The first capacitor C1 comprises a first plate 114, a second plate 116, and ferroelectric material 118 between the first and second plates 114 and 116. The second capacitor C2 comprises a first plate 120 and a second plate 122, and ferroelectric material 124 between the first and second plates 120 and 122. The second transistor T2 is above the first capacitor C1 and the fourth transistor T4 is above the second capacitor C2.

In the shown embodiment the second plates 116 and 122 are container-shaped outer plates, and the first plates 114 and 120 are inner plates which extend into the container-shaped outer plates. In other embodiments the second plates 116 and 122 may have other configurations, and the first plates 114 and 120 may also have other configurations.

The first plates 114 and 120 are coupled to the second transistor T2 and fourth transistor T4, respectively. The second and fourth transistors T2 and T4 are coupled to a plate line structure CP provided above the second and fourth transistors T2 and T4.

The first and second capacitors C1 and C2 are laterally displaced relative to one another, and in the shown embodiment are in a same horizontal plane as one another (i.e., are horizontally aligned with one another).

The first transistor T1 is between the first capacitor C1 and the digit line BL-T, and the third transistor T3 is between the second capacitor C2 and the digit line BL-C. In the shown embodiment the first and third transistors T1 and T3 are in a common horizontal plane as one another, and the word line WL0 extends along such horizontal plane and comprises the gates 130 and 160 of the first and third transistors T1 and T3. The second transistor T2 is between the first capacitor C1 and the plate line structure CP and the fourth transistor T4 is between the second capacitor C2 and the plate line structure CP. In the shown embodiment the second and fourth transistors T2 and T4 are in a common horizontal plane as one another, and the word line WL0 extends along such horizontal plane and comprises the gates 144 and 180 of the second and fourth transistors T2 and T4. The first and third transistors T1 and T3 are in a common horizontal plane that is vertically displaced from the common horizontal plane of the second and fourth transistors T2 and T4.

A first semiconductor pillar 128 extends upwardly from the digit line BL-T to the second plate 116 of the first capacitor C1, and the first transistor T1 is along such first semiconductor pillar 128. A second semiconductor pillar 140 extends downwardly from the plate line structure CP to the first plate 114 of the first capacitor C1, and the second transistor T12 is along such second pillar. A third semiconductor pillar 170 extends upwardly from the digit line BL-C to the second plate 122 of the second capacitor C2, and the third transistor T3 is along the third semiconductor pillar 170. A fourth semiconductor pillar 190 extends downwardly from the plate line structure CP to the first plate 120 of the second capacitor C2, and the fourth transistor T4 is along the fourth semiconductor pillar 190.

The first transistor T1 includes the gate dielectric material 132, the first channel region, and source/drain regions 136 and 138. The source/drain region 136 is coupled with the second plate 116 of first capacitor C1, and the source/drain region 138 is coupled with the digit line BL-T. The third transistor T3 includes the gate dielectric material 172, the third channel region, and source/drain regions 174 and 176. The source/drain region 174 is coupled with the second plate 122 of second capacitor C2, and the source/drain region 176 is coupled with the digit line BL-C. The second transistor T2 includes the gate dielectric material 142, the second channel region, and source/drain regions 148 and 150. The source/drain region 148 is coupled with the first plate 114 of first capacitor C1, and the source/drain region 150 is coupled with the plate line structure CP. The fourth transistor T4 includes the gate dielectric material 182, the second channel region, and source/drain regions 194 and 196. The source/drain region 194 is coupled with the first plate 120 of second capacitor C2, and the source/drain region 196 is coupled with the plate line structure CP.

The memory cell 105(1) similar to memory cell 105(0), and comprises first and second capacitors C1 and C2 together with first, second, third, and fourth transistors T1, T2, T3, and T4. The first and third transistors T1 and T3 comprise conductive gates 130 and 160 which are coupled with a second word line WL1. The second and fourth transistors T2 and T4 comprise conductive gates 144 and 180 which are coupled with a second word line WL1. The first plates 114 and 120 of the first and second capacitors C1 and C2 are coupled with the second and fourth transistors T2 and T4 and the second plates 116 and 122 of the first and second capacitors C1 and C2 are coupled with the first and third transistors T1 and T3.

The memory cell 105(1) comprises first and third transistors T1 and T3 which are laterally displaced relative to one another. The memory cell 105(1) comprises the first capacitor C1 below the first transistor T1, and comprises the second capacitor C2 below the third transistor T3. The first capacitor C1 comprises a first plate 114, a second plate 116, and ferroelectric material 118 between the first and second plates 114 and 116. The second capacitor C2 comprises a first plate 120, a second plate 122, and ferroelectric material 124 between the first and second plates 120 and 122. The second and fourth transistors T2 and T4 are vertically displaced from the first and third transistors T1 and T3, respectively, and the second and fourth transistors T2 and T4 are between the capacitors C1 and C2 and the plate line structure CP.

In the illustrated embodiment the digit line BL-T and BL-C are in a common horizontal plane as one another. An axis 171 extending through the digit lines BL-T and BL-C may be considered to define a mirror plane. The memory cell 105(1) may be considered to be a substantially mirror image of the memory cell 105(0) across the mirror plane. The term "substantially mirror image" is utilized to indicate that the memory cell 105(1) may be a mirror image of the memory cell 105(0) to within reasonable tolerances of fabrication and measurement.

Figure 13A:
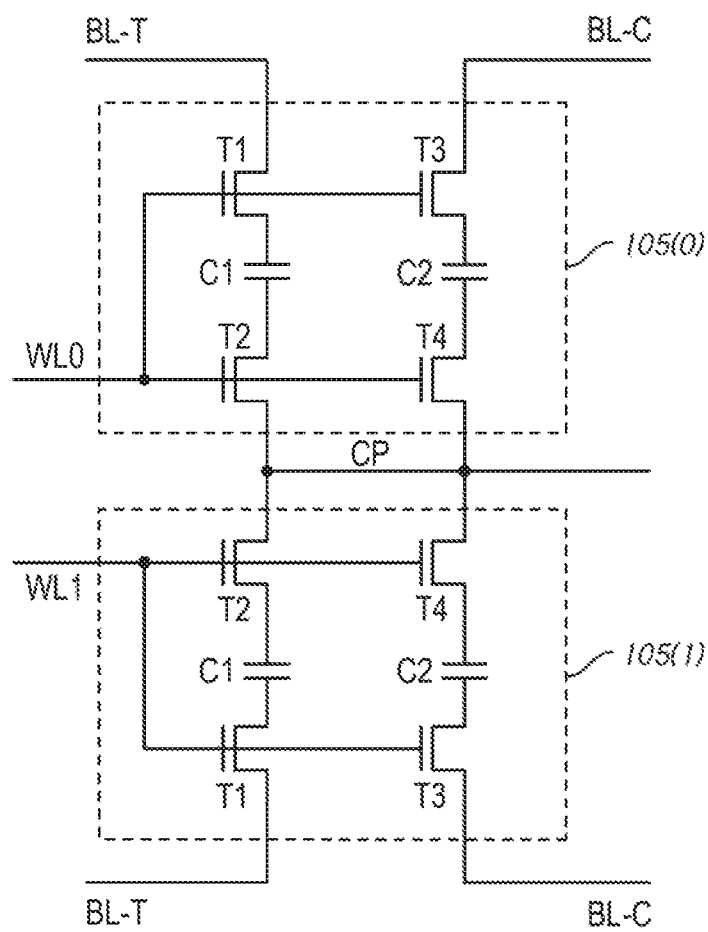
FIG. 13A is a schematic diagram of example memory cells including four transistors and two capacitors according to an embodiment of the disclosure.
Figure 13B:
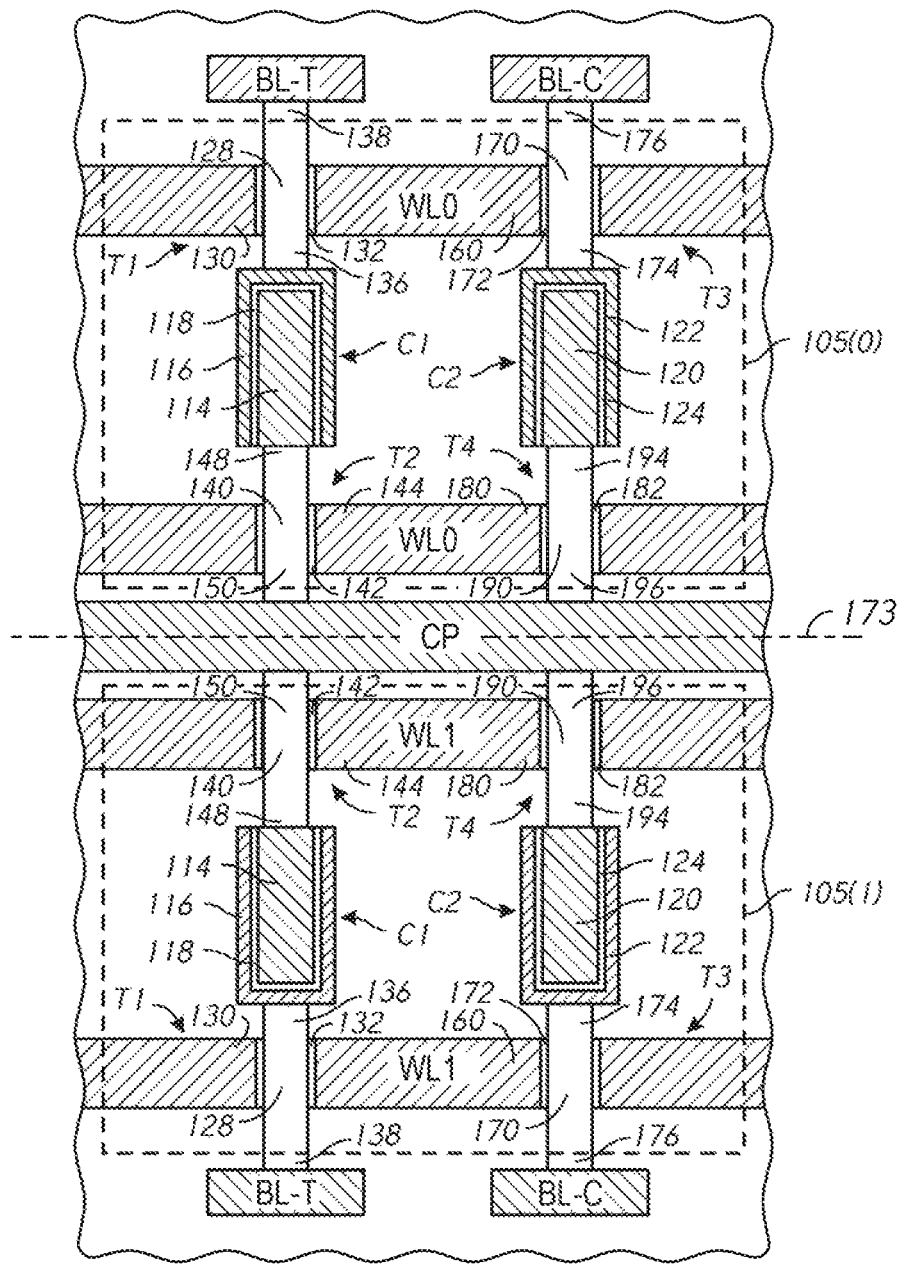
FIG. 13B is a diagrammatic cross-sectional side view of a region of an example memory array showing example memory cells including four transistors and two capacitors according to an embodiment of the disclosure.

In the illustrated embodiment of FIG. 12B the digit lines BL-T and BL-C are shared by the memory cells 105(0) and 105(1). In other embodiments a plate line structure CP may be shared by memory cells 105(0) and 105(1) which are vertically displaced on opposing sides of the plate line structure CP from one another. FIGS. 13A and 13B illustrate an example of such other embodiments.

FIG. 13A is a schematic diagram of two memory cells 105(0) and 105(1) according to an embodiment of the disclosure. A dashed line demarcates an approximate boundary of the memory cell 105. Each of the memory cells 105 includes four selection components T1-T4 and two capacitors C1 and C2. The capacitors C1 and C2 may be ferroelectric capacitors. The selection components T1-T4 may be transistors, for example, n-type field effect transistors. In such an example, each of the memory cells 105 includes four transistors and two capacitors (e.g., 4T2C).

The memory cells 105(0) and 105(1) of FIG. 13A share a plate line structure CP and are coupled to different digit lines BL-T and different digit lines BL-C. In contrast, the memory cells 105(0) and 105(1) of FIG. 12A share digit line BL-T and share digit line BL-C and are coupled to different plate lines CP.

Operation of the memory cells 105(0) and 105(1) of FIG. 13A is similar to the operation of the memory cells 105(0) and 105(1) of FIG. 12A, and will not be repeated in the interest of brevity.

FIG. 13B shows a portion of a memory array 10 comprising a pair of memory cells 105(0) and 105(1) of FIG. 13A according to an embodiment of the disclosure. In the embodiment of FIG. 13B the memory cell 105(0) is vertically stacked over the memory cell 105(1). A dashed line demarcates an approximate boundary of the memory cells 105(0) and 105(1). In some embodiments the memory cells 105 of FIG. 13B may be considered to comprise memory cells within an $8F^2$ architecture, where F indicates a minimum features size of a given technology.

The illustrated portion of memory array 10 may be supported by a base (not shown) analogous to the base of FIG. 4B. A horizontally-extending plate line structure CP is between the memory cells 105(0) and 105(1), and extends along the cross-section of FIG. 13B. The plate line structure CP is shared by the memory cells 105(0) and 105(1). The memory cell 105(0) comprises first, second, third, and fourth transistors T1-T4. The first and third transistors T1 and T3 are laterally displaced relative to one another, and the second and fourth transistors T2 and T4 which are laterally displaced relative to one another. The memory cell 105(0) comprises a first capacitor C1 between the first and second transistors T1 and T2, and comprises a second capacitor C2 between the third and fourth transistors T3 and T4. In contrast to the memory cells of FIG. 12B, the memory cells 105(0) and 105(1) of FIG. 13B share a plate line structure CP and are coupled to different digit lines BL-T and different digit lines BL-C.

The first capacitor C1 comprises a first plate 114, a second plate 116, and first ferroelectric material 118. The second capacitor C2 comprises a first plate 120 and a second plate 122, and ferroelectric material 124 between the first and second plates 120 and 122. In the memory cell 105(1), the second transistor T2 is above the first capacitor C1 and the fourth transistor T4 is above the second capacitor C2.

The first capacitor C1 comprises a first plate 114, a second plate 116, and first ferroelectric material 118. The second capacitor C2 comprises a first plate 120 and a second plate 122, and ferroelectric material 124 between the first and second plates 120 and 122. The second transistor T2 is above the first capacitor C1 and the fourth transistor T4 is above the second capacitor C2.

In the shown embodiment the second plates 116 and 122 are container-shaped outer plates, and the first plates 114 and 120 are inner plates which extend into the container-shaped outer plates. In other embodiments the second plates 116 and 122 may have other configurations, and the first plates 114 and 120 may also have other configurations.

The first plates 114 and 120 are coupled to the second transistor T2 and fourth transistor T4, respectively. The second and fourth transistors T2 and T4 are coupled to a plate line structure CP provided below the second and fourth transistors T2 and T4.

The first and second capacitors C1 and C2 are laterally displaced relative to one another, with the second capacitor C2 being in a same horizontal plane as the first capacitor C1.

The first transistor T1 is between the first capacitor C1 and the digit line BL-T, and the third transistor T3 is between the second capacitor C2 and the digit line BL-C. In the shown embodiment the first and third transistors T1 and T3 are in a common horizontal plane as one another, and the word line WL0 extends along such horizontal plane and comprises the gates 130 and 160 of the first and third transistors T1 and T3. The second transistor T2 is between the first capacitor C1 and the plate line structure CP and the fourth transistor T4 is between the second capacitor C2 and the plate line structure CP. In the shown embodiment the second and fourth transistors T2 and T4 are in a common horizontal plane as one another, and the word line WL0 extends along such horizontal plane and comprises the gates 144 and 180 of the second and fourth transistors T2 and T4. The first and third transistors T1 and T3 are in a common horizontal plane that is vertically displaced from the common horizontal plane of the second and fourth transistors T2 and T4.

A first semiconductor pillar 128 extends downwardly from the digit line BL-T to the second plate 116 of the first capacitor C1, and the first transistor T1 is along such first semiconductor pillar 128. A second semiconductor pillar 140 extends upwardly from the plate line structure CP to the first plate 114 of the first capacitor C1, and the second transistor T2 is along such second pillar. A third semiconductor pillar 170 extends downwardly from the digit line BL-C to the second plate 122 of the second capacitor C2, and the third transistor T3 is along the third semiconductor pillar 170. A fourth semiconductor pillar 190 extends upwardly from the plate line structure CP to the first plate 120 of the second capacitor C2, and the fourth transistor T4 is along the fourth semiconductor pillar 190.

The first transistor T1 includes the gate dielectric material 132, the first channel region, and source/drain regions 136 and 138. The source/drain region 136 is coupled with the second plate 116 of first capacitor C1, and the source/drain region 138 is coupled with the digit line BL-T. The third transistor T3 includes the gate dielectric material 172, the third channel region, and source/drain regions 174 and 176. The source/drain region 174 is coupled with the second plate 122 of second capacitor C2, and the source/drain region 176 is coupled with the digit line BL-C.

The second transistor T2 includes the gate dielectric material 142, the second channel region, and source/drain regions 148 and 150. The source/drain region 148 is coupled with the first plate 114 of first capacitor C1, and the source/drain region 150 is coupled with the plate line structure CP. The fourth transistor T4 includes the gate dielectric material 182, the second channel region, and source/drain regions 194 and 196. The source/drain region 194 is coupled with the first plate 120 of second capacitor C2, and the source/drain region 196 is coupled with the plate line structure CP.

The memory cell 105(1) similar to memory cell 105(0), and comprises first and second capacitors C1 and C2 together with first, second, third, and fourth transistors T1, T2, T3, and T4. The first and third transistors T1 and T3 comprise conductive gates 130 and 160 which are coupled with a second word line WL1. The second and fourth transistors T2 and T4 comprise conductive gates 144 and 180 which are coupled with a second word line WL. The first plates 114 and 120 of the first and second capacitors C1 and C2 are coupled with the second and fourth transistors T2 and T4 and the second plates 116 and 122 of the first and second capacitors C1 and C2 are coupled with the first and third transistors T1 and T3.

The memory cell 105(1) comprises first and third transistors T1 and T3 which are laterally displaced relative to one another. The memory cell 105(1) comprises the first capacitor C1 above the first transistor T1, and comprises the second capacitor C2 above the third transistor T3. The first capacitor C1 comprises a first plate 114, a second plate 116, and ferroelectric material 118 between the first and second plates 114 and 116. The second capacitor C2 comprises a first plate 120, a second plate 122, and ferroelectric material 124 between the first and second plates 120 and 122. The second and fourth transistors T2 and T4 are vertically displaced from the first and third transistors T1 and T3 and the second and fourth transistors T2 and T4 are between the capacitors C1 and C2 and the plate line structure CP. In the illustrated embodiment the digit line BL-T and BL-C are in a common horizontal plane as one another. An axis 173 extending through the plate line structure CP may be considered to define a mirror plane. The memory cell 105(1) may be considered to be a substantially mirror image of the memory cell 105(0) across the mirror plane. The term "substantially mirror image" is utilized to indicate that the memory cell 105(1) may be a mirror image of the memory cell 105(0) to within reasonable tolerances of fabrication and measurement.

In the illustrated embodiment of FIG. 13B the digit line BL-T of memory cell 105(0) (i.e., the digit line BL-T above word line WL0) and the digit line BL-T of memory cell 105(1) (i.e., the digit line BL-T below word line WL1) are coupled to one another. The digit line BL-C of memory cell 105(0) (i.e., the digit line BL-C above word line WL0) and the digit line BL-C of memory cell 105(1) (i.e., the digit line BL-C below word line WL1) are coupled to one another. Electrical properties of the coupled digit lines BL-T are compared with those of the coupled digit lines BL-C with a sense component 25 of the type described above with reference to FIGS. 1 and 2.

Various embodiments of memory cells having two, three, or four transistors and two capacitors have been disclosed with reference to FIGS. 1-13. The transistors in some embodiments of the memory cells may be vertical transistors each formed from a respective semiconductor pillar. The conductive materials of the first and second plates of the capacitors C1 and C2 may be any suitable conductive materials, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc. Some or all of plates of the capacitors C1 and C2 may comprise the same composition as one another, or may comprise different compositions relative to one another.

The capacitors C1 and C2 are ferroelectric capacitors. The ferroelectric materials of the capacitors C1 and C2 may comprise any suitable composition or combination of compositions. In some embodiments the capacitor dielectric materials may comprise ferroelectric material. For instance, the capacitor dielectric materials may comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, niobium, strontium, and a rare earth element. In some embodiments the ferroelectric materials may comprise a same composition as one another, and in other embodiments may comprise different compositions relative to one another.

The plate line structure CP may comprise any suitable conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc.

The semiconductor pillars may comprise any suitable semiconductor materials including, for example, one or both of silicon and germanium. The source/drain regions, and channel region, may be doped with any suitable dopants. In some embodiments the source/drain regions may be n-type majority doped, and in other embodiments may be p-type majority doped.

The word lines (WL0 and WL1) and digit lines (BL-T and BL-C) may comprise any suitable electrically conductive material, including, for example, one or more of various metals (e.g., tungsten, titanium, etc.), metal-containing compositions (e.g., metal nitride, metal carbide, metal silicide, etc.), conductively-doped semiconductor materials (e.g., conductively-doped silicon, conductively-doped germanium, etc.), etc. The word lines and digit lines may comprise the same composition as one another, or may comprise different compositions relative to one another.

Insulative material may surround the various components of memory cells disclosed herein. Such insulative material may comprise any suitable composition or combination of compositions; including, for example, one or more of silicon dioxide, silicon nitride, borophosphosilicate glass, spin-on dielectric, etc. Although insulative material may be a single homogeneous material in some embodiments, in other embodiments the insulative material may include two or more discrete insulative compositions.

Although the memory cells 105(0) and 105(1) are shown vertically stacked in FIGS. 5B, 6B, 9B, 10B, 12B, and 13B, in some embodiments of the invention, a single layer of memory cells is included in a memory array. For example, in some embodiments a memory array includes a single layer of memory cells 105(1), without memory cells 105(0) stacked thereon.

FIG. 14 illustrates a block diagram of a portion of memory 1400 that includes memory array 10 that supports a ferroelectric memory in accordance with various embodiments of the present disclosure. Memory array 10 may be referred to as an electronic memory apparatus and includes memory controller 40 and memory cell 105, which may be examples of memory controller 40 and memory cell 105 described with reference to FIG. 1, 2, or 4-13.

Memory controller 40 may include biasing component 1405 and timing component 1410, and may operate memory array 10 as described in FIG. 1. Memory controller 40 may be in electronic communication with word lines 12, digit lines 15, and sense component 25, which may be examples of word line 12, digit line 15, and sense component 25 described with reference to FIG. 1, 2, or 4-13. The components of memory array 10 may be in electronic communication with each other and may perform the functions described with reference to FIGS. 1-13.

Memory controller 40 may be configured to activate word lines 12 or digit lines 15 by applying voltages to the word and digit lines. For example, biasing component 1405 may be configured to apply a voltage to operate memory cell 105 to read or write memory cell 105 as described above. In some cases, memory controller 40 may include a row decoder, column decoder, or both, as described with reference to FIG. 1. This may enable memory controller 40 to access one or more memory cells 105. Biasing component 1405 may also provide voltage potentials for the operation of sense component 25.

Memory controller 40 may further determine a logic state of the ferroelectric memory cell 105 based on activating sense component 25, and write the logic state of the ferroelectric memory cell 105 back to the ferroelectric memory cell 105.

In some cases, memory controller 40 may perform its operations using timing component 1410. For example, timing component 1410 may control the timing of the various word line selections or plate line biasing, including timing for switching and voltage application to perform the memory functions, such as reading and writing, discussed herein. In some cases, timing component 1410 may control the operations of biasing component 1405. For example, the memory controller 40 may control the biasing component 1405 to provide a read voltage VREAD to the plate line CP to change the voltage of the memory cell, the digit lines BL-T and BL-C, and sense node A and sense node B of sense component 25. Following the biasing of the plate line CP, the memory controller 40 may control the sensing component 25 to compare the voltage of sense node A to the voltage of sense node B.

Upon determining and amplifying the voltage difference, the sense component 25 may latch the state, where it may be used in accordance with the operations of an electronic device that memory array 10 is a part.

Figure 15:
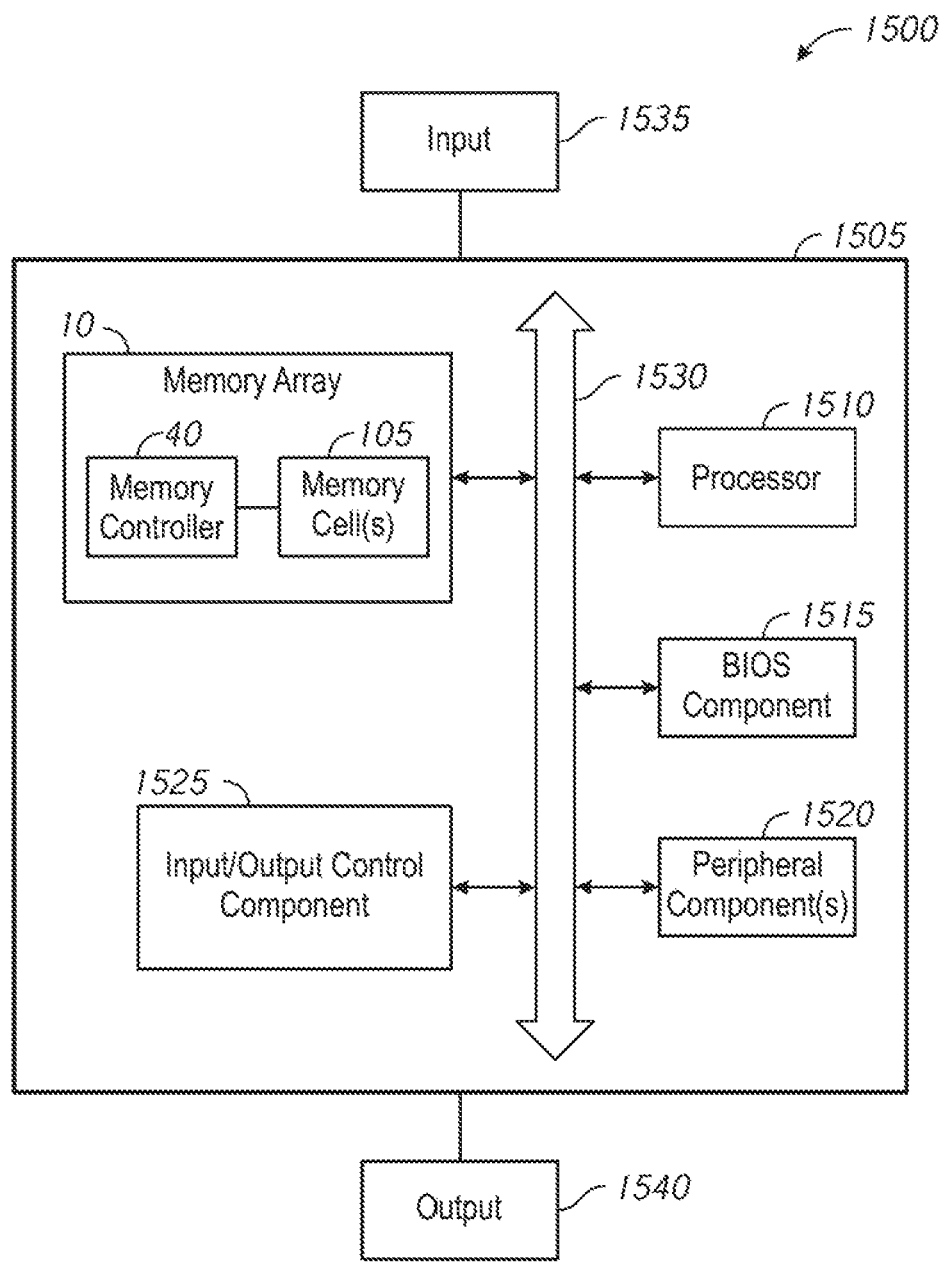
FIG. 15 is a block diagram of a system that supports a ferroelectric memory in accordance with various embodiments of the present disclosure.

FIG. 15 illustrates a system 1500 that supports a ferroelectric memory in accordance with various embodiments of the present disclosure. System 1500 includes a device 1505, which may be or include a printed circuit board to connect or physically support various components. Device 1505 may be a computer, notebook computer, laptop, tablet computer, mobile phone, or the like. Device 1505 includes a memory array 10, which may be an example of memory array 10 as described with reference to FIGS. 1 and 4-13. Memory array 10 may contain memory controller 40 and memory cell(s) 105, which may be examples of memory controller 40 described with reference to FIGS. 1 and 14 and memory cells 105 described with reference to FIGS. 1, 2, and 4-13. Device 1505 may also include a processor 1510, BIOS component 1515, peripheral component(s) 1520, and input/output control component 1525. The components of device 1505 may be in electronic communication with one another through bus 1530.

Processor 1510 may be configured to operate memory array 10 through memory controller 40. In some cases, processor 1510 may perform the functions of memory controller 40 described with reference to FIGS. 1 and 8. In other cases, memory controller 40 may be integrated into processor 1510. Processor 1510 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. The processor 1510 may perform various functions and operate the memory array 10 as described herein. Processor 1510 may, for example, be configured to execute computer-readable instructions stored in memory array 10 to cause device 1505 perform various functions or tasks.

BIOS component 1515 may be a software component that includes a basic input/output system (BIOS) operated as firmware, which may initialize and run various hardware components of system 1500. BIOS component 1515 may also manage data flow between processor 1510 and the various components, e.g., peripheral components 1520, input/output control component 1525, etc. BIOS component 1515 may include a program or software stored in read-only memory (ROM), flash memory, or any other non-volatile memory.

Peripheral component(s) 1520 may be any input or output device, or an interface for such devices, that is integrated into device 1505. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 1525 may manage data communication between processor 1510 and peripheral component(s) 1520, input devices 1535, or output devices 1540. Input/output control component 1525 may also manage peripherals not integrated into device 1505. In some cases, input/output control component 1525 may represent a physical connection or port to the external peripheral.

Input 1535 may represent a device or signal external to device 1505 that provides input to device 1505 or its components. This may include a user interface or interface with or between other devices. In some cases, input 1535 may be a peripheral that interfaces with device 1505 via peripheral component(s) 1520 or may be managed by input/output control component 1525.

Output 1540 may represent a device or signal external to device 1505 configured to receive output from device 1505 or any of its components. Examples of output 1540 may include a display, audio speakers, a printing device, another processor or printed circuit board, etc. In some cases, output 1540 may be a peripheral that interfaces with device 1505 via peripheral component(s) 1520 or may be managed by input/output control component 1525.

The components of memory controller 40, device 1505, and memory array 10 may be made up of circuitry designed to carry out their functions. This may include various circuit elements, for example, conductive lines, transistors, capacitors, inductors, resistors, amplifiers, or other active or inactive elements, configured to carry out the functions described herein.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
    a first capacitor including a first plate, a second plate, and a ferroelectric material disposed between the first and second plates, the first plate coupled to a plate line structure;
    a second capacitor including a first plate, a second plate, and a ferroelectric material disposed between the first and second plates, the first plate coupled to the plate line structure;
    a first transistor vertically displaced relative to the first capacitor and coupled to the second plate of the first capacitor, wherein the first transistor includes a first semiconductor pillar disposed between the second plate of the first capacitor and a digit line; and
    a second transistor vertically displaced relative to the second capacitor and coupled to the second plate of the second capacitor.

2. The apparatus of claim 1 wherein the first semiconductor pillar extending from the second plate of the first capacitor, and wherein the second transistor includes a second semiconductor pillar extending from the second plate of the second capacitor.

3. The apparatus of claim 2 wherein the first transistor includes a channel region within the first semiconductor pillar and source/drain regions included in the first semiconductor pillar.

4. The apparatus of claim 1 wherein the first transistor and the second transistor are vertically displaced relative to one another.

5. The apparatus of claim 1 wherein the first transistor and the second transistor are laterally displaced relative to one another.

6. The apparatus of claim 1 wherein the first and second transistors are in a common horizontal plane and the first and second transistors include respective gates along a word line that extends along the horizontal plane.

7. The apparatus of claim 1 wherein the first transistor and the first capacitor are included in a first memory cell and the second transistor and the second capacitor are included in a second memory cell, and wherein the first and second capacitors are vertically displaced relative to one another and wherein the plate line structure is shared by the first and second memory cells.

8. An apparatus comprising:
    a first capacitor including a first plate, a second plate, and a ferroelectric material disposed between the first and second plates, the first plate coupled to a plate line structure;
    a second capacitor including a first plate a second plate and a ferroelectric material disposed between the first and second plates, the first plate coupled to the plate line structure,
    wherein the first plates of the first and second capacitor share a common composition with the plate line structure;
    a first transistor vertically displaced relative to the first capacitor and coupled to the second plate of the first capacitor; and
    a second transistor vertically displaced relative to the second capacitor and coupled to the second plate of the second capacitor.

9. An apparatus, comprising:
    a first memory cell; and
    a second memory cell;
    wherein each memory cell comprises:
        a first transistor;
        a first ferroelectric capacitor including a ferroelectric material, coupled to the first transistor and vertically displaced relative to the first transistor;
        a second transistor;

a second ferroelectric capacitor coupled to the second transistor and vertically displaced relative to the second transistor;
a first digit line shared by the first and second memory cells;
a second digit line coupled to the first memory cell; and
a third digit line coupled to the second memory cell.

10. The apparatus of claim 9, further comprising:
a plate line structure shared by the first and second memory cells.

11. The apparatus of claim 10 wherein the first and second memory cells are laterally displaced relative to one another.

12. The apparatus of claim 9 wherein the first and second memory cells are vertically displaced on opposing sides of one of a plate line structure shared by the first and second memory cells or the first digit line shared by the first and second memory cells.

13. The apparatus of claim 9,
wherein the second digit line is shared by the first and second memory cells.

14. An apparatus, comprising:
a first ferroelectric capacitor including first and second plates;
a second ferroelectric capacitor including first and second plates, wherein the first and second ferroelectric capacitors are vertically displaced relative to one another;
a first transistor including a first semiconductor pillar coupled to the second plate of the first ferroelectric capacitor and disposed between the first ferroelectric capacitor and a first digit line; and
a second transistor including a second semiconductor pillar coupled to the second plate of the second ferroelectric capacitor and disposed between the second ferroelectric capacitor and a second digit line.

15. The apparatus of claim 14 wherein the first and second digit lines are in a common horizontal plane.

16. The apparatus of claim 14, further comprising:
a third transistor including a third semiconductor pillar coupled to the first plates of the first and second capacitors and disposed between the first and second capacitors and a plate line structure.

17. The apparatus of claim 16 wherein the third semiconductor pillar has a different dimension for of at least one of a channel length or a channel width.

18. The apparatus of claim 16 wherein the third transistor is vertically displaced re to the first and second transistors.

19. The apparatus of claim 18 wherein the third transistor is above the first and second transistors.

20. The apparatus of claim 18 wherein the third transistor is below the first and second transistors.

21. The apparatus of claim 14, further comprising:
a third transistor including a third semiconductor pillar coupled to the first plate of the first capacitor and disposed between the first capacitor and a plate line structure; and
a fourth transistor including a fourth semiconductor pillar coupled to the first plate of the second capacitor and disposed between the second capacitor and the plate line structure.

22. An apparatus, comprising:
a first capacitor including first and second plates, and further including a ferroelectric material disposed between the first and second plates;
a second capacitor including first and second plates, and further including a ferroelectric material disposed between the first and second plates;
a first vertical transistor disposed between the second plate of the first capacitor and a first digit line;
a second vertical transistor disposed between the second plate of the second capacitor and a second digit line; and
a third vertical transistor disposed between the first plates of the first and second capacitors and a plate line structure, wherein the third vertical transistor is vertically displaced from the first and second vertical transistors.

23. The apparatus of claim 22 wherein the first and second transistors are in a common horizontal plane.

24. The apparatus of claim 22, further comprising:
a first word line including gates of the first and second transistors; and
a second word line including a gate of the third transistor.

25. The apparatus of claim 24 wherein the first word line extends along a first horizontal plane and the second word line extends along a second horizontal plane that is vertically displaced from the horizontal plane of the first word line.

26. The apparatus of claim 22 wherein first and second capacitors, and the first, second, and third vertical transistors are included in a first memory cell, and wherein the first and second digit lines are shared with a second memory cell over which the first memory cell is stacked.

27. The apparatus of claim 22 wherein first and second capacitors, and the first, second, and third vertical transistors are included in a first memory cell, and wherein the plate line structure is shared with a second memory cell over which the first memory cell is stacked.

28. An apparatus, comprising:
a first ferroelectric capacitor including first and second plates;
a second ferroelectric capacitor including first and second plates;
a first vertical transistor disposed between the second plate of the first ferroelectric capacitor and a first digit line;
a second vertical transistor disposed between the first plate of the first ferroelectric capacitor and a plate line structure, wherein the first vertical transistor is vertically displaced from the second vertical transistor;
a third vertical transistor disposed between the second plate of the second ferroelectric capacitor and a second digit line; and
a fourth vertical transistor disposed between the first plate of the second ferroelectric capacitor and the plate line structure, wherein the third vertical transistor is vertically displaced from the fourth vertical transistor.

29. The apparatus of claim 28 wherein the first, second, third, and fourth vertical transistors are in a common vertical plane.

30. The apparatus of claim 28 wherein first and third vertical transistors are in a first common horizontal plane as one another and the second and fourth vertical transistors are in a second common horizontal plane as one another.

31. The apparatus of claim 30 wherein the first common horizontal plane is vertically displaced from the second common horizontal plane.

32. The apparatus of claim 30, further comprising a word line including gates of the first and third transistors, wherein the word line extends along the first common horizontal plane.

33. The apparatus of claim 28 wherein first and second ferroelectric capacitors, and the first, second, third, and fourth vertical transistors are included in a first memory cell, and wherein the first and second digit lines are shared with a second memory cell over which the first memory cell is stacked.

34. The apparatus of claim 28 wherein first and second ferroelectric capacitors, and the first, second, third, and fourth vertical transistors are included in a first memory cell, and wherein the plate line structure is shared with a second memory cell over which the first memory cell is stacked.

35. The apparatus of claim 28 wherein each of the first, second, third, and fourth transistors comprises:
- a semi conductor pillar;
- a gate dielectric material;
- a channel region in the semiconductor pillar; and
- source/drain regions in the semiconductor pillar.

* * * * *

UNITED STATES PATENT AND TRADEMARK OFFICE
CERTIFICATE OF CORRECTION

PATENT NO. : 10,153,018 B2
APPLICATION NO. : 15/678978
DATED : December 11, 2018
INVENTOR(S) : Scott J. Derner and Christopher J. Kawamura It is certified that error appears in the above-identified patent and that said Letters Patent is hereby corrected as shown below:

In the Claims

| | Reads | Should Read |
|---|---|---|
| Column 36, Line 46 in Claim 8, | "a second capacitor including a first plate a second plate and a ferroelectric material disposed between the first and second plates, the first plate coupled to the plate line structure, wherein the first plates of the first and second capacitor share a common composition with the plate line structure;" | --a second capacitor including a first plate, a second plate, and a ferroelectric material disposed between the first and second plates, the first plate coupled to the plate line structure, wherein the first plates of the first and second capacitor share a common composition with the plate line structure;-- |
| Column 37, Line 46 in Claim 18, | "The apparatus of claim 16 wherein the third transistor is vertically displaced re to the first and second transistors." | --The apparatus of claim 16 wherein the third transistor is vertically displaced relative to the first and second transistors.-- |

Signed and Sealed this
Twenty-sixth Day of March, 2019

Andrei Iancu
*Director of the United States Patent and Trademark Office*